(12) United States Patent
Mizukami et al.

(10) Patent No.: US 7,986,000 B2
(45) Date of Patent: Jul. 26, 2011

(54) SEMICONDUCTOR DEVICE AND METHOD OF MANUFACTURING THE SAME

(75) Inventors: Makoto Mizukami, Kawasaki (JP);
Kiyohito Nishihara, Yokohama (JP);
Masaki Kondo, Kawasaki (JP); Takashi Izumida, Yokohama (JP); Hirokazu Ishida, Yokohama (JP); Atsushi Fukumoto, Yokohama (JP); Fumiki Aiso, Yokohama (JP); Daigo Ichinose, Yokohama (JP); Tadashi Iguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 12/564,349

(22) Filed: Sep. 22, 2009

(65) Prior Publication Data
US 2010/0117135 A1 May 13, 2010

(30) Foreign Application Priority Data
Nov. 10, 2008 (JP) .................................. 2008-288010

(51) Int. Cl.
*H01L 29/76* (2006.01)
*H01L 21/00* (2006.01)
*H01L 21/84* (2006.01)

(52) U.S. Cl. ......... 257/314; 257/E21.704; 257/E27.112; 438/151

(58) Field of Classification Search .................. 257/314, 257/E21.704, E27.112; 438/151
See application file for complete search history.

(56) References Cited

U.S. PATENT DOCUMENTS

| 6,838,360 | B2 * | 1/2005 | Kumazaki | 438/493 |
| 7,432,561 | B2 | 10/2008 | Mizukami et al. | |
| 7,442,978 | B2 * | 10/2008 | Yaegashi | 257/296 |
| 7,459,748 | B2 | 12/2008 | Shirota et al. | |
| 7,553,728 | B2 | 6/2009 | Mizukami et al. | |
| 7,781,275 | B2 * | 8/2010 | Yang | 438/164 |
| 2006/0049449 | A1 | 3/2006 | Iino et al. | |
| 2008/0128780 | A1 | 6/2008 | Nishihara et al. | |
| 2008/0157092 | A1 | 7/2008 | Arai et al. | |
| 2008/0169497 | A1 | 7/2008 | Iino et al. | |
| 2008/0315280 | A1 | 12/2008 | Watanabe et al. | |

FOREIGN PATENT DOCUMENTS
JP 2006-73939 3/2006
* cited by examiner

Primary Examiner — David S Blum
(74) Attorney, Agent, or Firm — Oblon, Spivak, McClelland, Maier & Neustadt, L.L.P.

(57) ABSTRACT

A semiconductor device is formed on a SOI substrate having a semiconductor substrate, a buried oxide film formed on the semiconductor substrate, and a semiconductor layer formed on the buried oxide film, the semiconductor substrate having a first conductive type, the semiconductor layer having a second conductive type, wherein the buried oxide film has a first opening opened therethrough for communicating the semiconductor substrate with the semiconductor layer, the semiconductor layer is arranged to have a first buried portion buried in the first opening in contact with the semiconductor substrate and a semiconductor layer main portion positioned on the first buried portion and on the buried oxide film, the semiconductor substrate has a connection layer buried in a surface of the semiconductor substrate and electrically connected to the first buried portion in the first opening, the connection layer having the second conductive type, and the semiconductor device includes a contact electrode buried in a second opening, a side surface of the contact electrode being connected to the semiconductor layer main portion, a bottom surface of the contact electrode being connected to the connection layer, the second opening passing through the semiconductor layer main portion and the buried oxide film, and the second opening reaching a surface portion of the connection layer.

19 Claims, 20 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2008-288010 filed on Nov. 10, 2008 in Japan, the entire contents of which are incorporated herein by reference.

BACKGROUND OF THE INVENTION

1. Field of the Invention

The present invention relates to a semiconductor device and a method of manufacturing the same.

2. Related Art

Recently, semiconductor devices using a silicon on insulator (SOI) substrate have been developed. The SOI substrate is a substrate having a structure in which a buried oxide (BOX) layer (buried oxide film) is buried between a semiconductor substrate and a semiconductor layer (SOI layer). The SOI substrate is used as a substrate of, for example, a NAND type non-volatile semiconductor memory device (refer to JP-A 2006-73939 (KOKAI)).

In a semiconductor device formed using the SOI substrate, a film thickness of a semiconductor layer is optimized based on design items such as an operation frequency, a breakdown voltage, a maximum current value, and the like. For example, in a one side gate MOS static induction transistor (MOS-SIT) structure having a MOS gate on a surface of the SOI substrate, it is possible to make a semiconductor layer thin to improve cut-off characteristics.

However, when it was intended to dispose a contact electrode to a thin semiconductor layer having a thickness of, for example, about several tens of nanometers, a problem arose in that a contact resistance became higher than that when a thick semiconductor layer was used because a contact area (areas of a side surface and a bottom portion of a contact electrode in contact with a semiconductor layer) became insufficient. Further, it was difficult to stably control a depth of the contact electrode in the thin semiconductor layer. Accordingly, when the contact electrode reached a BOX layer formed under the semiconductor layer, a problem arose in that since the bottom portion of the contact electrode could not come into contact with the semiconductor layer, a contact resistance was increased by a further decrease of the contact area. Further, even if the bottom portion of the contact electrode could be formed in the semiconductor layer, since the semiconductor layer was thinned between the bottom portion of the contact electrode and the BOX layer, a problem arose in that the contact resistance was increased.

Further, when it was intended to reduce the contact resistance by causing a material of the contact electrode to react with the semiconductor layer, the semiconductor material was absorbed into the material of the contact electrode. Accordingly, a problem also arose in that partial disconnection occurred between the semiconductor layer and the contact electrode because the semiconductor material became insufficient in the vicinity of the contact electrode.

The following structure is considered to overcome these problems. That is, the structure is a contact structure arranged such that a semiconductor layer is formed after a BOX layer of a contact region is entirely removed, and a bottom portion of a contact electrode is connected to a conductive region disposed on a surface of a semiconductor substrate of the contact region. However, when the BOX layer of the contact region is entirely removed regardless of that a channel region of a transistor includes the semiconductor layer, a step corresponding to a thickness of the BOX layer is formed on the surface of the semiconductor layer and remains as a groove. The groove shape causes a new problem in a subsequent manufacturing process in that a wire is broken or, an unnecessary film buried in a groove is not sufficiently removed in a chemical mechanical polishing (CMP) process and remains, and the like in a wiring step.

SUMMARY OF THE INVENTION

According to one aspect of the embodiments of the present invention, there is provided a semiconductor device formed on a SOI substrate having a semiconductor substrate, a buried oxide film formed on the semiconductor substrate, and a semiconductor layer formed on the buried oxide film, the semiconductor substrate having a first conductive type, the semiconductor layer having a second conductive type, wherein the buried oxide film has a first opening opened therethrough for communicating the semiconductor substrate with the semiconductor layer, the semiconductor layer is arranged to have a first buried portion buried in the first opening in contact with the semiconductor substrate and a semiconductor layer main portion positioned on the first buried portion and on the buried oxide film, the semiconductor substrate has a connection layer buried in a surface of the semiconductor substrate and electrically connected to the first buried portion in the first opening, the connection layer having the second conductive type, and the semiconductor device includes a contact electrode buried in a second opening, a side surface of the contact electrode being connected to the semiconductor layer main portion, a bottom surface of the contact electrode being connected to the connection layer, the second opening passing through the semiconductor layer main portion and the buried oxide film, and the second opening reaching a surface portion of the connection layer.

According to another aspect of the embodiments of the present invention, there is provided a method of manufacturing a semiconductor device, comprising: forming a buried oxide film on a semiconductor substrate having a first conductive type; forming a first opening in the buried oxide film, the first opening reaching a surface portion of the semiconductor substrate; forming a semiconductor layer on the semiconductor substrate in the first opening and on the buried oxide film; after the semiconductor layer is formed, forming a connection layer in a certain surface portion of the semiconductor substrate, the certain surface portion being located under the first opening and a peripheral portion of the first opening, the connection layer having a second conductive type; forming a diffusion layer in a specific portion of the semiconductor layer, the diffusion layer being connected to the connection layer through the first opening, the specific portion being located above the connection layer, the diffusion layer having the second conductive type; forming a second opening in the diffusion layer and in the buried oxide film, the second opening reaching a surface portion of the connection layer; and forming a contact electrode in the second opening.

DETAILED DESCRIPTION OF THE INVENTION

Figure 1:
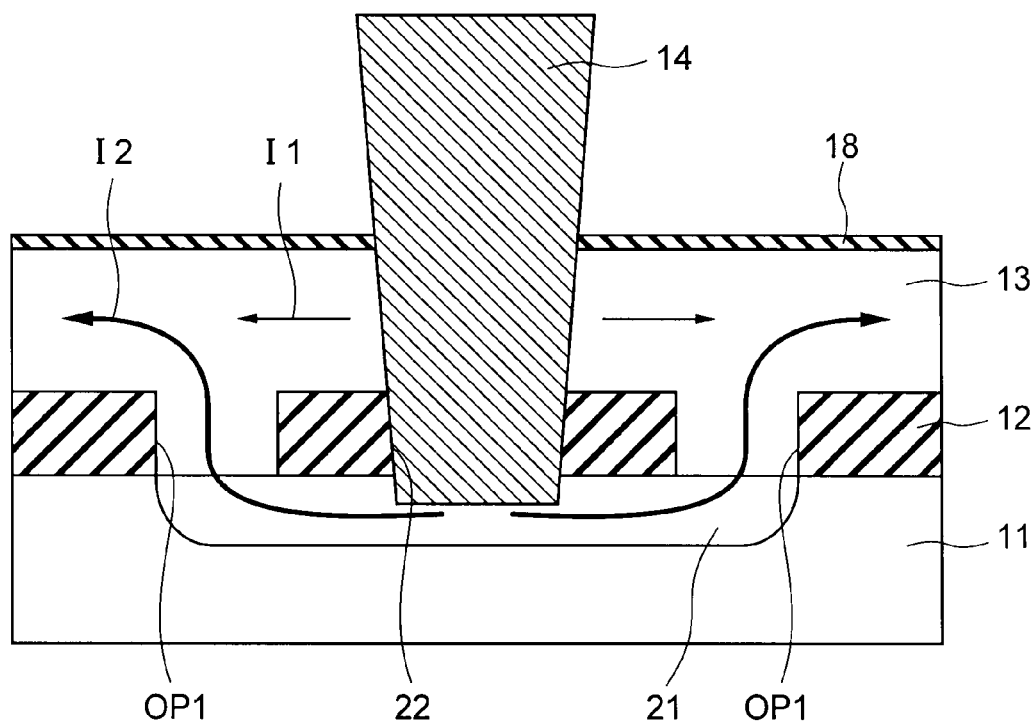
FIG. 1 is a sectional view of a contact region of a semiconductor device according to a first embodiment of the present invention.

Embodiments of the present invention will be described below referring to the drawings. These embodiments do not restrict the present invention.

First Embodiment

A first embodiment of the present invention will be described referring to FIG. 1. The first embodiment is arranged such that a current can effectively flow from a side surface and a bottom portion of a contact electrode in a semiconductor device using a SOI substrate.

FIG. 1 is a sectional view of a contact region of the semiconductor device according to the first embodiment. The drawing shows, for example, a drain contact region or a source contact region of a transistor and the like formed on a SOI substrate. However, illustration of a structure other than the contact region will be omitted.

As shown in the drawing, the semiconductor device is arranged using the SOI substrate having a semiconductor substrate (called also a silicon substrate or a support substrate) 11, a BOX layer (buried oxide film) 12 on the semiconductor substrate 11, and a semiconductor layer (the SOI layer, a silicon layer) 13 on the BOX layer 12.

Description will be given here assuming, for example, that the semiconductor substrate 11 has a P-type conductivity and the semiconductor layer 13 has an $N^+$-type conductivity.

A gate insulating film 18 is formed on the semiconductor layer 13. Openings OP1 (first openings) are formed in the BOX layer 12. The semiconductor layer 13 includes buried portions, which are buried in the openings OP1 in contact with the semiconductor substrate 11 and a semiconductor layer main portion which is positioned on the buried portions and on the BOX layer 12.

The semiconductor substrate 11 has an $N^+$-type connection diffusion layer (connection layer) 21 formed in a surface portion in a buried state. The connection diffusion layer 21 is electrically connected to the semiconductor layer 13 through the openings OP1.

A contact opening 22 (second opening) reaches a surface portion of the connection diffusion layers 21 passing through the gate insulating film 18, the semiconductor layer 13, and the BOX layer 12.

The contact electrode 14 is buried in the contact opening 22, electrically connected to the semiconductor layer 13 on a side surface, and electrically connected to the connection diffusion layers 21 on a bottom surface. Any of, for example, titanium (Ti), tungsten (W), cobalt (Co), nickel (Ni), platinum (Pt), iron (Fe), and the like can be used as a material of barrier metal formed a side and a bottom surface of the contact electrode 14.

As described above, the openings OP1 are disposed in addition to the contact opening 22 and the respective openings OP1 are electrically connected to each other by the connection diffusion layers 21 having the same conductive type as that of the semiconductor layer 13, to return a current, which flows from (or flows in) the contact electrode 14 in contact with a portion in the semiconductor substrate 11 side under the BOX layer 12, to the semiconductor layer 13 acting as a channel region.

With this configuration, the current can flow not only through a current path I1 shown in the drawing but also through a current path I2.

As described above, according to the first embodiment, since a current path from the bottom portion of the contact electrode 14 to the semiconductor layer 13 through the connection diffusion layers 21 and the openings OP1 is also formed in addition to a current path from a part of the side surface of the contact electrode 14 to the semiconductor layer 13, a contact resistance can be reduced by increasing a contact area.

Further, since it is not necessary to entirely remove the BOX layer 12 of the contact region, flatness of a surface of the semiconductor layer 13 can be improved because a groove structure is unlike to be formed on the surface of the semiconductor layer 13.

Further, the contact opening 22 is also formed in the BOX layer 12 under the semiconductor layer 13 and a contact is formed also by the bottom portion of the contact electrode 14 and the connection diffusion layers 21 so that it is not necessary to form a contact only to a side surface of the semiconductor layer 13. With this configuration, a margin of a bottom position of the contact electrode can be secured in a depth direction. As a result, the contact resistance can be securely reduced even if the thin semiconductor layer 13 having a thickness of, for example, about several tens of nanometers is used.

Note that since it is sufficient that the semiconductor layer 13 be electrically connected to the connection diffusion layers 21 through the openings OP1, the number and the shape of the openings OP1 are not restricted to the illustrated ones.

Further, the contact openings 22 may be partially formed in the BOX layer 12 previously, before the semiconductor layer 13 and the like are formed. In this case, when the contact opening 22 is formed after the semiconductor layer 13 and the like are formed, it is not necessary to etch different materials of the semiconductor layer 13 and the BOX layer 12.

Second Embodiment

Next, a second embodiment of the present invention will be described referring to FIGS. 2 to 17. The second embodiment shows a semiconductor device (NAND type non-volatile semiconductor memory device) using the structure of the contact of the first embodiment.

(a) Structure

Figure 2:
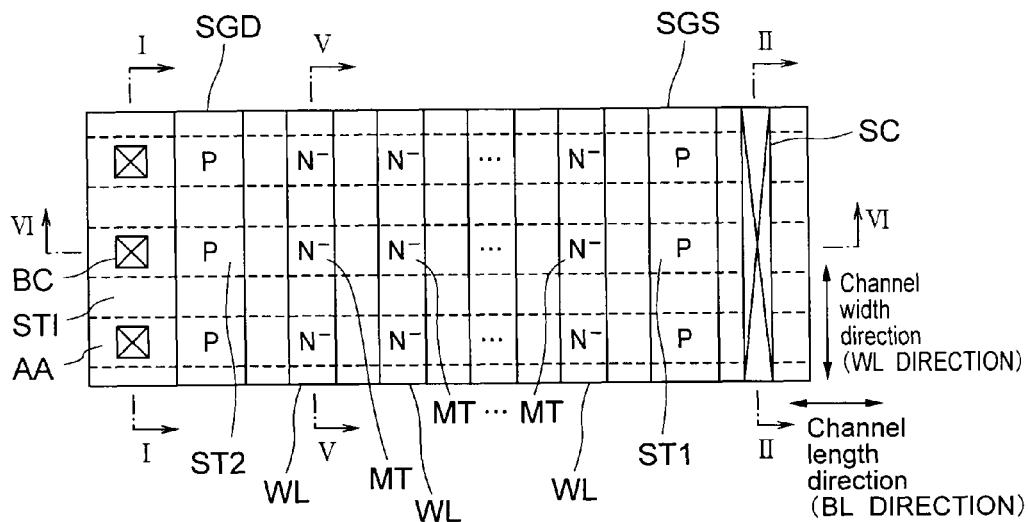
FIG. 2 is a plan view of a part of a semiconductor device according to a second embodiment of the present invention.
Figure 3:
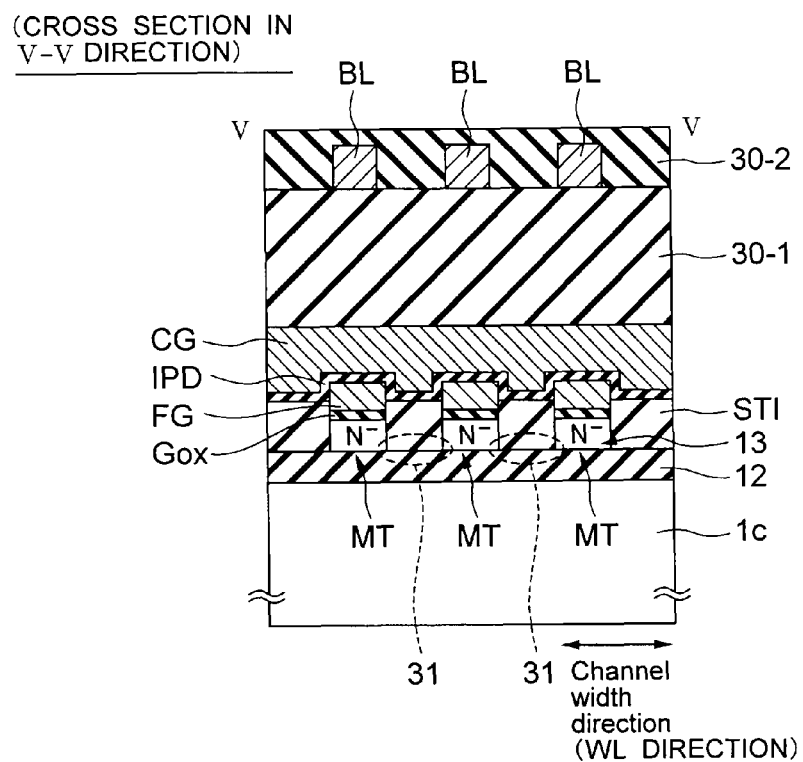
FIG. 3 is a sectional view along a line V-V of FIG. 2.
Figure 4:
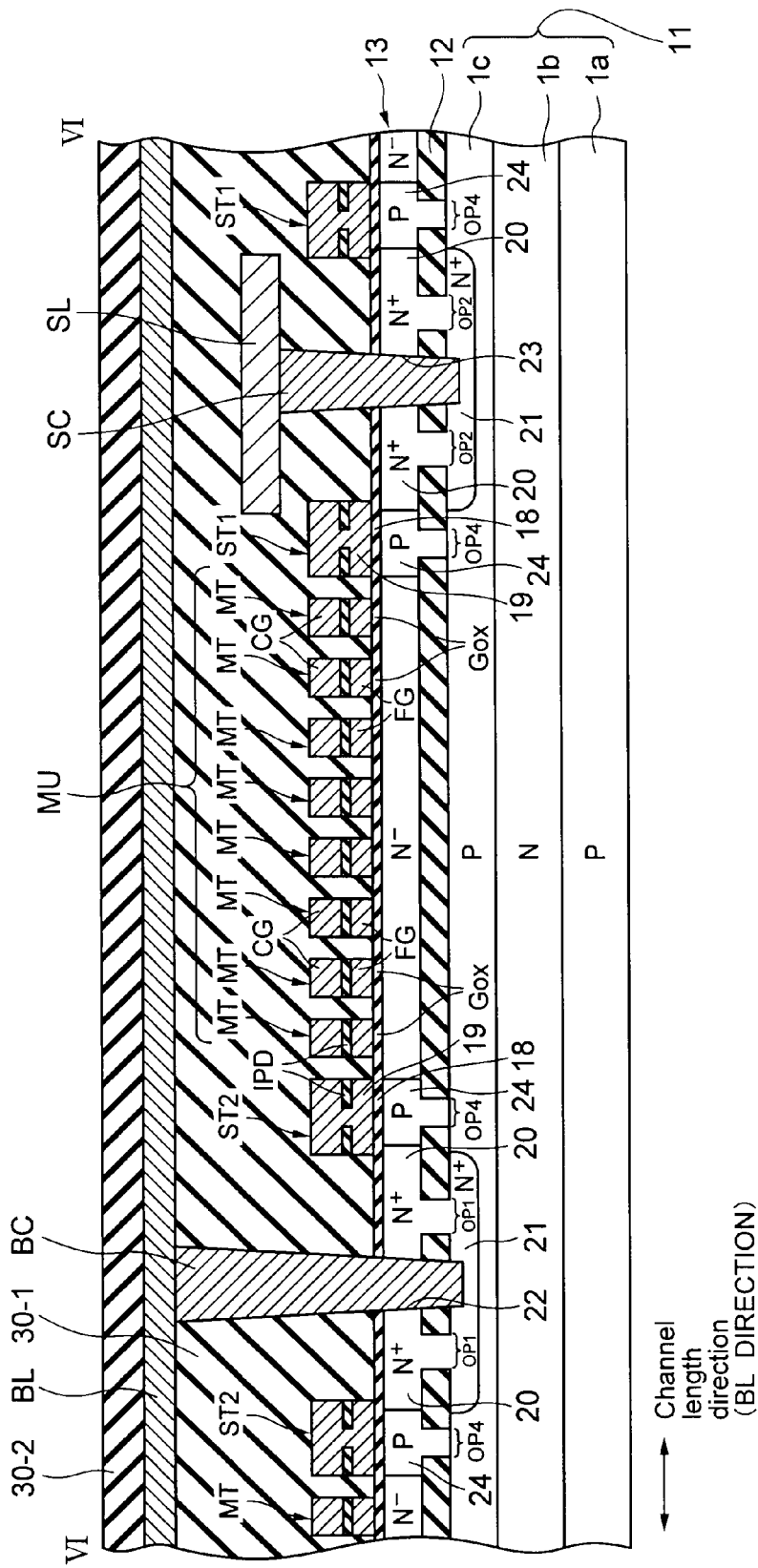
FIG. 4 is a sectional view along a line VI-VI of FIG. 2.
Figure 5:
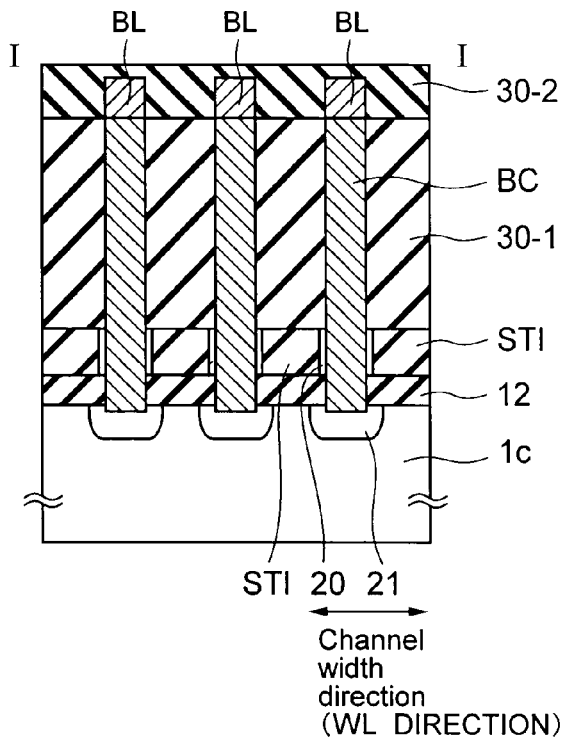
FIG. 5 is a sectional view along a line I-I of FIG. 2.
Figure 6:
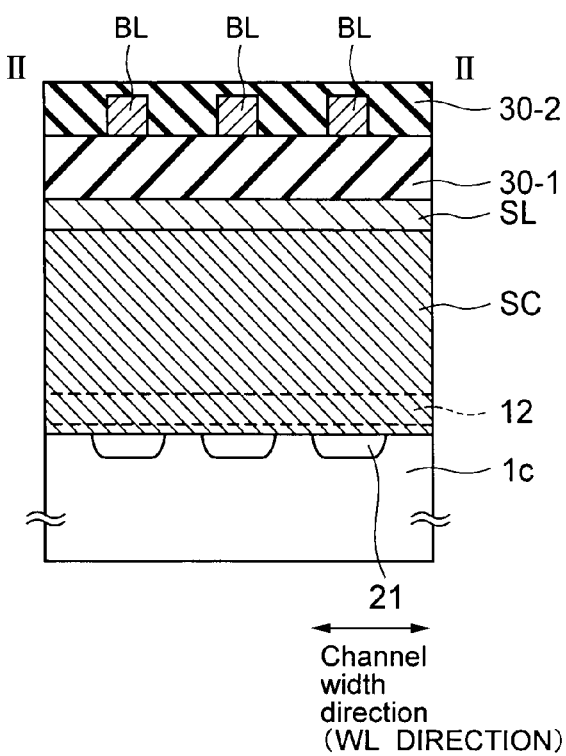
FIG. 6 is a sectional view along a line II-II of FIG. 2.

First, an example of a planar structure and an example of a cross sectional configuration of memory cell units MU, source side select transistors ST1 and drain side select transistors ST2 (switching transistors) of the semiconductor device according to the second embodiment will be described referring to FIGS. 2 to 6. FIG. 2 is a plan view of a part of the semiconductor device. FIG. 3 is a sectional view along a line V-V of FIG. 2. FIG. 4 is a sectional view along a line VI-VI of FIG. 2. FIG. 5 is a sectional view along a line I-I of FIG. 2. FIG. 6 is a sectional view along a line II-II of FIG. 2.

As shown in FIG. 2, device regions AA and device separation insulating film STI extend in a BL direction (first direction). The device regions AA and the device separation insulating film STI are alternately disposed in a WL direction (second direction). Word lines WL extend in the WL direction at predetermined intervals in the BL direction. Select gate lines SGD and SGS extending in the WL direction are disposed so as to sandwich the word lines therebetween. Memory cell transistors MT are formed at positions where the device regions AA cross the word lines WL. The source side select transistors ST1 are formed at positions where the device regions AA cross the select gate line SGS. The drain side select transistors ST2 are formed at positions where the device regions AA cross the select gate line SGD. That is, the semiconductor device includes a NAND string which has a plurality of the memory cell transistors MT arranged in the BL direction and the drain side select transistor and the source side select transistor disposed at both the ends thereof, and a plurality of the NAND strings are arranged in the WL direction. Further, in the following description, a term "inside" means a side to which the memory cell transistors MT are formed in the source side and drain side select transistors, and a term "outside" means a side opposite to the side to which the memory cell transistors MT are formed.

Further, bit-line contacts BC are formed on the respective device regions AA outside of the select gate line SGD. A source-line contact SC (common contact electrode) extending in the WL direction is formed outside of the select gate line SGS. Further, bit-lines (not shown), which are connected to the bit-line contacts BC and extend in the BL direction, are disposed above the device regions AA.

Next, a cross sectional structure will be described.

As shown in FIG. 4, the memory cell units MU and the source side and drain side select transistors ST1, ST2 are disposed on the semiconductor layer 13.

As shown in the drawing, the semiconductor device according to the second embodiment has a SOI substrate including a semiconductor (Si) layer 13 formed above a semiconductor (Si) substrate 11 by being separated by a BOX layer 12. Further, since openings are formed in the BOX layer 12, the SOI substrate may be called a partial SOI substrate.

In the semiconductor layer 13, $N^-$ wells are formed below the memory cell units MU, P-wells are formed below the source side and drain side select transistors ST1, ST2, and an $N^+$ diffusion layer ($N^+$ wells) 20 is formed around the bit-line contacts BC and the source-line contact SC, respectively.

Each memory cell unit MU is disposed on the semiconductor layer 13 and has a plurality (eight, in this embodiment) of memory cell transistors MT to which a current path is connected in series.

Each memory cell transistor MT has a laminated structure (gate structure) including a tunnel insulating film $G_{ox}$, floating gate electrodes FG, an inter-gate insulating film IPD, and a control electrode CG, sequentially disposed on the semiconductor layer ($N^-$ layer) 13. Further, to reduce a resistance of the semiconductor layer 13 on which the memory cell units MU are formed, a diffusion layer including an $N^+$ layer may be formed in the semiconductor layer 13 among the memory cell transistors MT.

The source side and drain side select transistors ST1, ST2 are disposed adjacent to the memory cell units MU along the BL direction to select a memory cell unit MU. A gate insulating film 18 is formed on the semiconductor layer 13, and gate electrodes 19 are formed on the gate insulating film 18. Further, each gate electrode 19 includes an upper layer gate electrode and a lower layer gate electrode, and an inter-gate insulating film IPD with an opening is formed in each gate electrode 19. A material of the upper layer gate electrode is the same as that of the control electrode CG of each memory cell transistor MT, a material of the lower layer gate electrode is the same as that of the floating gate electrode FG thereof, and a material of the inter-gate insulating film is the same as that of the inter-gate insulating film IPD thereof. Further, the $N^+$ diffusion layer 20 described above is formed as a source/drain diffusion layer in the semiconductor layer 13 between the source side select transistors ST1, ST1 and between the drain side select transistors ST2, ST2.

Further, channels 24 of the source side and drain side select transistors ST1, ST2 are interposed between the $N^+$ diffusion layer 20 and the semiconductor layer ($N^-$ layer) 13. Further, the channels 24 are formed on openings OP4 (fourth openings), and a P-well 1c is electrically connected to the channels 24 through the openings OP4. A high potential is applied to the P-well 1c to erase a charge accumulated to the floating gate electrodes FG of the memory cell transistors MT, and it is necessary to transfer the high potential to the semiconductor layer ($N^-$ layer) 13. Here, the high potential can be transferred by the openings OP4 from the P-well 1c to the semiconductor layer ($N^-$ layer) 13 through the channels 24.

An inter-layer insulating film 30-1 is disposed to cover the memory cell units MU and the source side and drain side select transistors ST1, ST2.

The bit-line contacts BC and the source-line contact SC employ the contact structure according to the first embodiment to reduce the contact resistance.

That is, in the BOX layer 12, openings OP1 (first openings) are formed between contact openings 22 and the drain side select transistors ST2, and openings OP2 (first openings) are formed between contact openings 23 and the source side select transistors ST1.

The semiconductor substrate 11 has $N^+$ connection diffusion layers 21 formed in a surface portion in a buried state.

The connection diffusion layers 21 are electrically connected to the N⁺ diffusion layer 20 in the semiconductor layer 13 through the respective openings OP1, OP2.

The contact openings 22, 23 (second openings) reach a surface portion of the connection diffusion layers 21 passing through the inter-layer insulating film 30-1, the gate insulating films 18, the semiconductor layer 13, and the BOX layer 12.

Conductive layers of titanium (Ti) and the like (a similar material to that of the first embodiment) are buried in the respective contact openings 22, 23 to thereby form the bit-line contacts BC and the source-line contact SC. The bit-line contacts BC and the source-line contact SC are electrically connected to the N⁺ diffusion layer 20 through side surfaces and electrically connected to the connection diffusion layers 21 through bottom surfaces.

A source line SL is disposed on the source-line contact SC and electrically connected to current paths of the source side select transistors ST1.

Bit lines BL are disposed on the bit-line contacts BC and electrically connected to current paths of the drain side select transistors ST2. Here, the BOX layer 12 is formed between the openings OP1 and OP1, and between the openings OP2 and OP2. Accordingly, in comparison with a case that large openings are formed by integrating the openings OP1 and OP1, and the openings OP2 and OP2 respectively, flatness of an upper surface of the semiconductor layer 13 is improved and the bit-lines BL and the like can be also formed to be flat so that a bit-line open and the like are unlike to occur.

An inter-layer insulating film 30-2 is disposed on the bit-lines BL.

Next, a cross section along a line VI-VI in FIG. 2 will be described.

As shown in FIG. 3, the floating gate electrodes FG are formed above the semiconductor layer 13 separated by the device separation insulating film STI. The control electrode CG is formed above the floating gate electrodes FG through the inter-gate insulating film IPD. The control electrode CG is seamlessly formed above the floating gate electrodes FG and constitutes the word lines WL.

Further, the BOX layer 12 is in contact with the device separation insulating film STI as shown by being surrounded by broken lines 31 in FIG. 3. Accordingly, the semiconductor layer 13 formed below the floating gate electrodes FG is surrounded by the insulating film, respectively, so that a breakdown voltage between the memory cell transistors MT can be improved. Note that even when the device separation insulating film STI passes through the BOX layer 12, a similar effect can be obtained because the semiconductor layer 13 formed below the floating gate electrodes FG is surrounded by the insulating film, respectively.

Next, a cross section along lines I-I and II-II in FIG. 2 will be described.

As shown in FIG. 5, bottom portions of the respective bit-line contacts BC are connected to the connection diffusion layers 21, and parts of side surfaces of the respective bit-line contacts BC at the front side in FIG. 5 are connected to the N⁺ diffusion layer 20.

As shown in FIG. 6, the source-line contact SC extends in the WL direction, and its bottom portion is connected to the connection diffusion layers 21.

Note that FIG. 6 shows a sectional view of a case that the source-line contact SC is formed by ideally etching. More specifically, a bottom portion of the source-line contact SC may not be flat depending on an etching condition.

(b) Manufacturing Method

Next, a method of manufacturing the semiconductor device according to a second embodiment will be described using FIGS. 7 to 14. The semiconductor device having a cross sectional structure shown in FIG. 4 will be described as to an example. The description will be given according to a flow of FIG. 7.

Step ST1 (Formation of BOX Layer)

Figure 8:
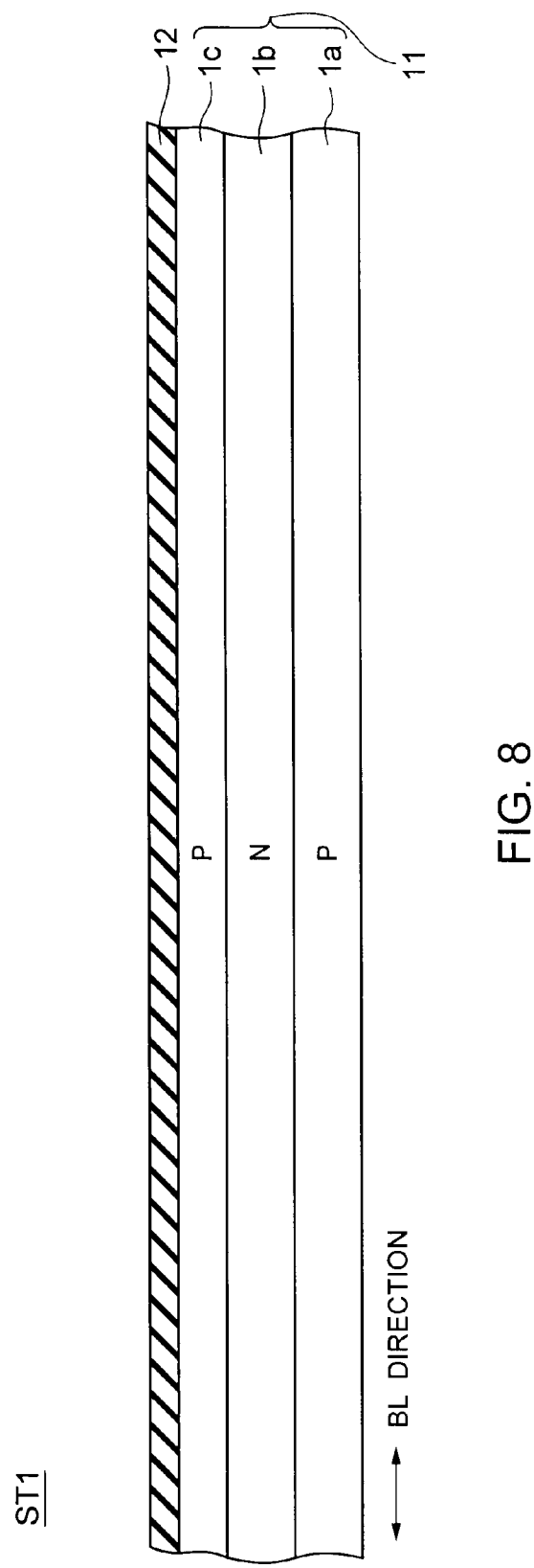
FIG. 8 is a sectional view explaining the manufacturing process of the semiconductor device according to the second embodiment of the present invention.

First, as shown in FIG. 8, a P-well 1*a* is formed by implanting a P-type impurity such as boron (B) and the like into the semiconductor substrate 11 using, for example, ion implantation technique and the like. Subsequently, an N-well 1*b* is formed on the P-well 1*a* by implanting an N-type impurity such as arsenic (As) and the like into the semiconductor substrate 11 using, for example, ion implantation technique and the like. Subsequently, a P-well 1*c* is formed on the N-well 1*b* by a similar process.

The BOX layer 12 is formed by forming a silicon oxide (SiO₂) film and the like to a thickness of about 40 nm on the semiconductor substrate 11 (P-well 1*c*) using, for example, chemical vapor deposition (CVD) method and the like.

Step ST2 (Formation of Seed Openings)

Figure 9:
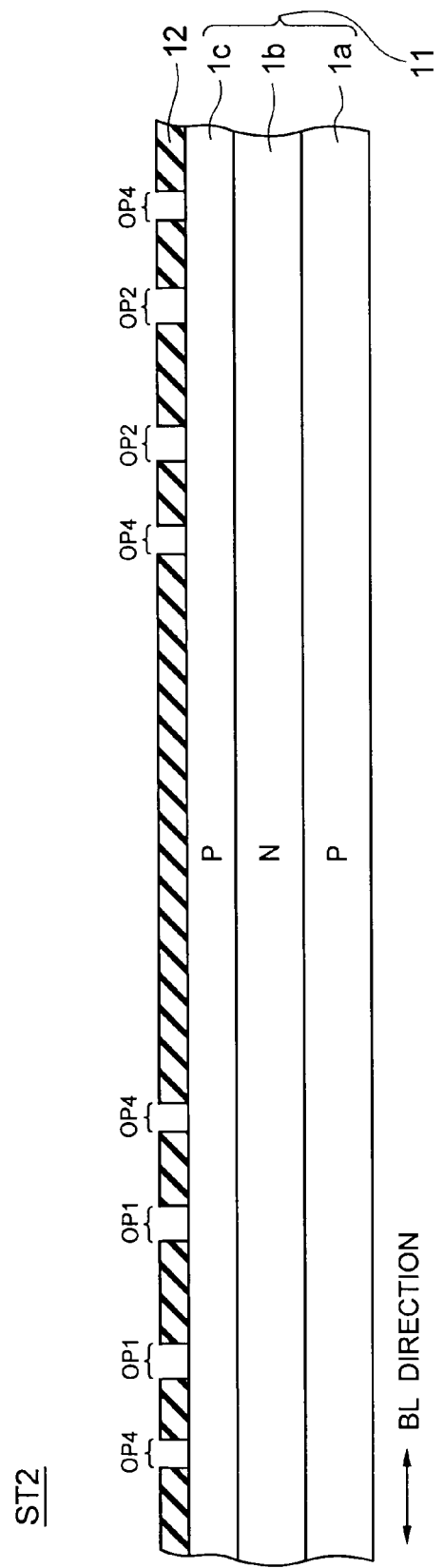
FIG. 9 is a sectional view explaining the manufacturing process of the semiconductor device following FIG. 8.

As shown in FIG. 9, the openings OP1, OP2, and OP4, from which a surface of the semiconductor substrate 11 (P-well 1*c*) is exposed, are formed between positions at which the source side select transistors ST1 are formed and positions at which the contact opening 23 is formed, between positions at which the drain side select transistors ST2 are formed and positions at which the contact openings 22 are formed, and at positions at which the channels 24 are formed, using, for example, photolithographic method and the like.

Step ST3 (Formation and Crystallization Anneal of a-Si)

Figure 10:
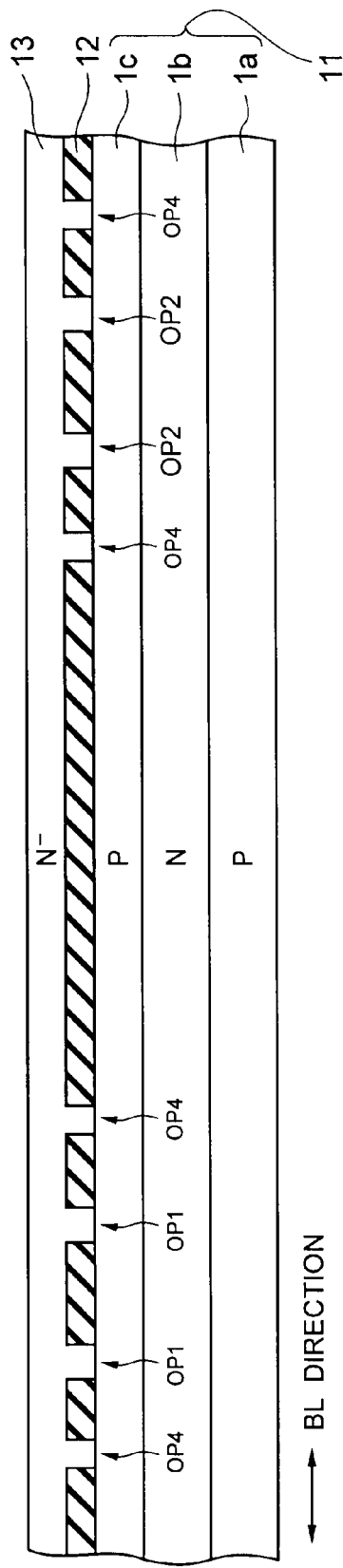
FIG. 10 is a sectional view explaining the manufacturing process of the semiconductor device following FIG. 9.

As shown in FIG. 10, an amorphous silicon (a-Si) layer is formed to be a thickness of about 20 nm to 100 nm on the BOX layer 12 using, for example, CVD method and the like.

Figure 11:
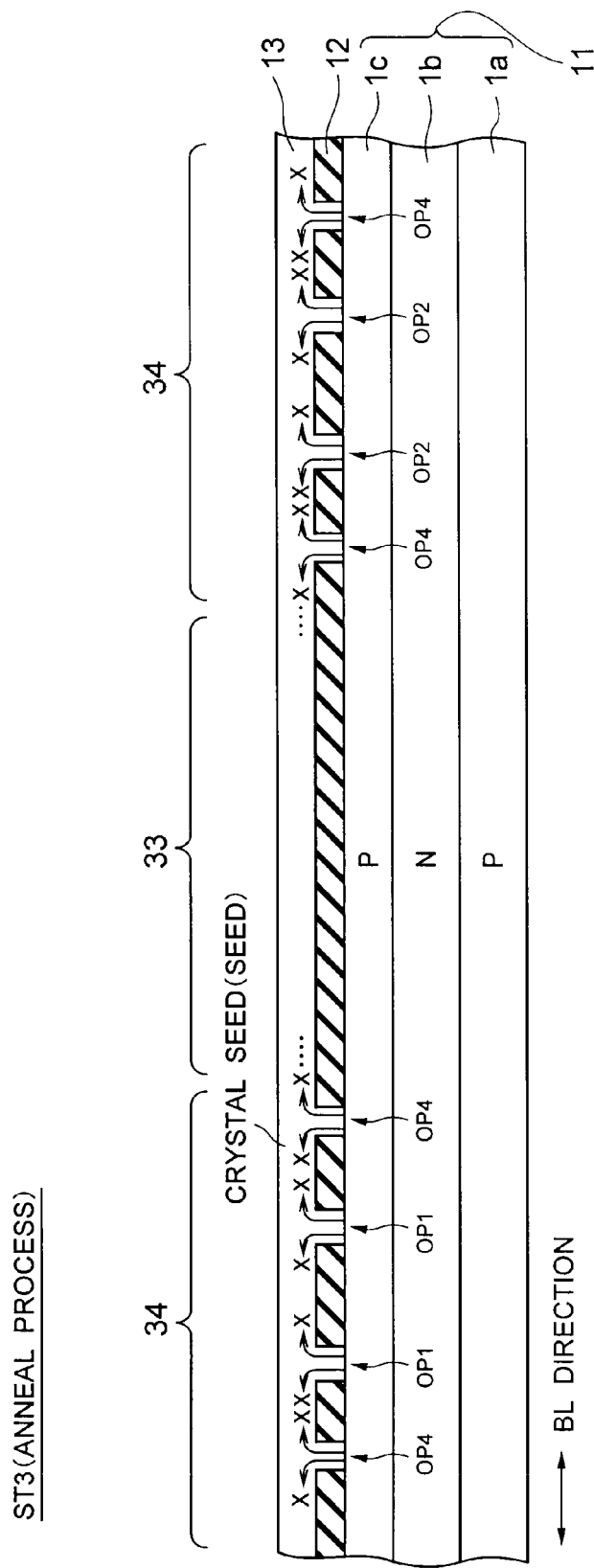
FIG. 11 is a sectional view explaining the manufacturing process of the semiconductor device following FIG. 10.

As shown in FIG. 11, the amorphous silicon layer is annealed at, for example, 450° C. to 700° C. At the time, an amorphous silicon layer is solid phase grown using crystals of the semiconductor substrate 11 exposed from the openings OP1, OP2, OP4 as crystal seeds (shown by X in FIG. 11) so that the semiconductor layer (crystalline silicon layer) 13 having good quality can be obtained. Further, in the anneal process, not only an ST area 34 in which the select transistors are formed but also the amorphous silicon layer in an MU area 33, in which the memory cell units MU are formed, can be also solid phase grown. Here, the openings OP1, OP2, OP4 are used seed openings.

Step ST4 (Formation of Connection Diffusion Layer; Pattern I)

Figure 12:
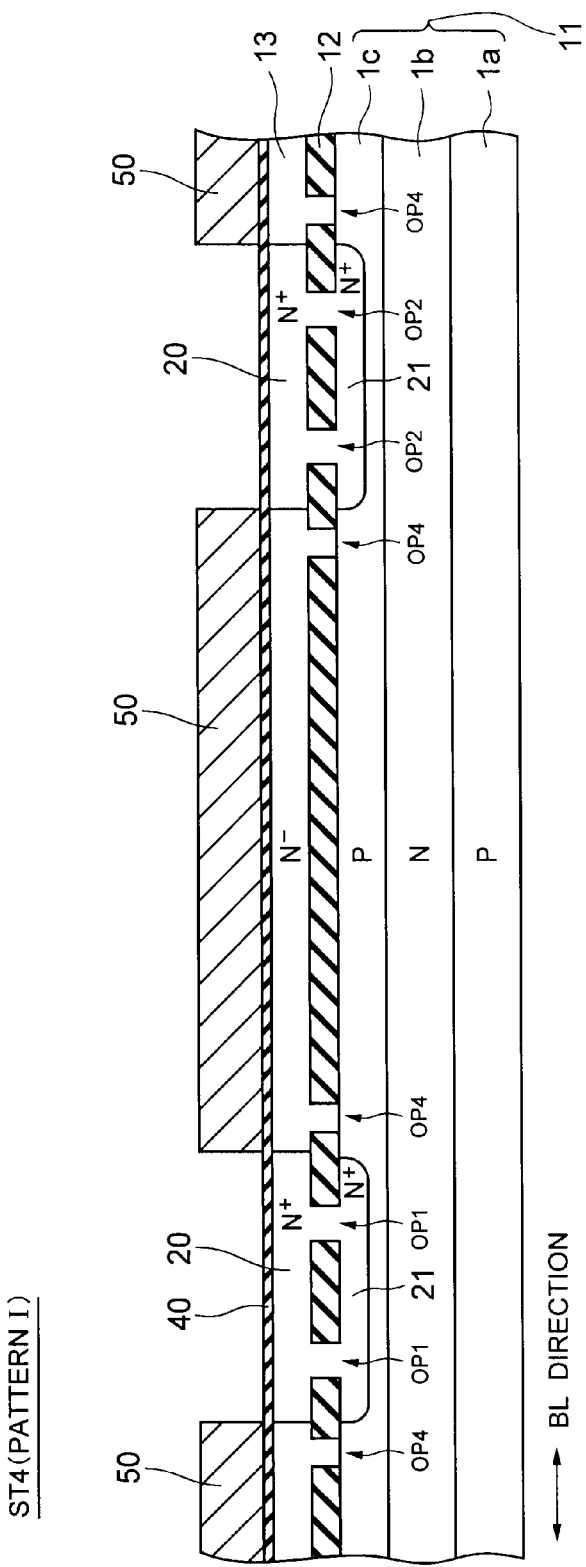
FIG. 12 is a sectional view explaining the manufacturing process of the semiconductor device following FIG. 11.

A sacrificial oxide film 40 is formed by, for example, thermally oxidizing an upper surface of the semiconductor layer 13. As shown in FIG. 12, a resist mask 50, which has openings above the openings OP1, OP2 between the source side select transistors ST1, ST1 and between the drain side select transistors ST2, ST2, is formed.

The connection diffusion layers 21 and the N⁺ diffusion layer 20 are formed from a surface of the semiconductor substrate 11 under the BOX layer 12 to the surface of the semiconductor layer 13 using ion implantation technique. The resist mask 50 and the sacrificial oxide film 40 are removed.

Note that it is also possible to increase an impurity concentration of the connection diffusion layers 21 under the BOX layer 12 and to reduce an impurity concentration of the N⁺ diffusion layer 20 in the surface of the semiconductor layer 13 by separately implanting ions several times. As a result, cut-off characteristics of the source side select transistors ST1 and the drain side select transistors ST2 can be improved.

Further, the connection diffusion layers 21 can be connected to the N+ diffusion layer 20 of the source side and drain side select transistors ST1, ST2 by forming the connection diffusion layers 21 from under the BOX layer 12 into the openings OP1, OP2 first, and forming the N+ diffusion layer 20 of the source side and drain side select transistors ST1, ST2 after step ST5 to be described later. As a result, the cut-off characteristics of the source side and drain side select transistors ST1, ST2 can be improved because the N+ diffusion layer 20 of the source side and drain side select transistors ST1, ST2 can be prevented from being expanded by thermal diffusion in a gate insulating film forming process and the like.

Further, the process can be performed simultaneously with an N-well forming process of peripheral transistors (not shown). As a result, a manufacturing process can be omitted.

Step ST5 (Formation of Tunnel Insulating Film, Control Gate, and the Like)

Figure 13:
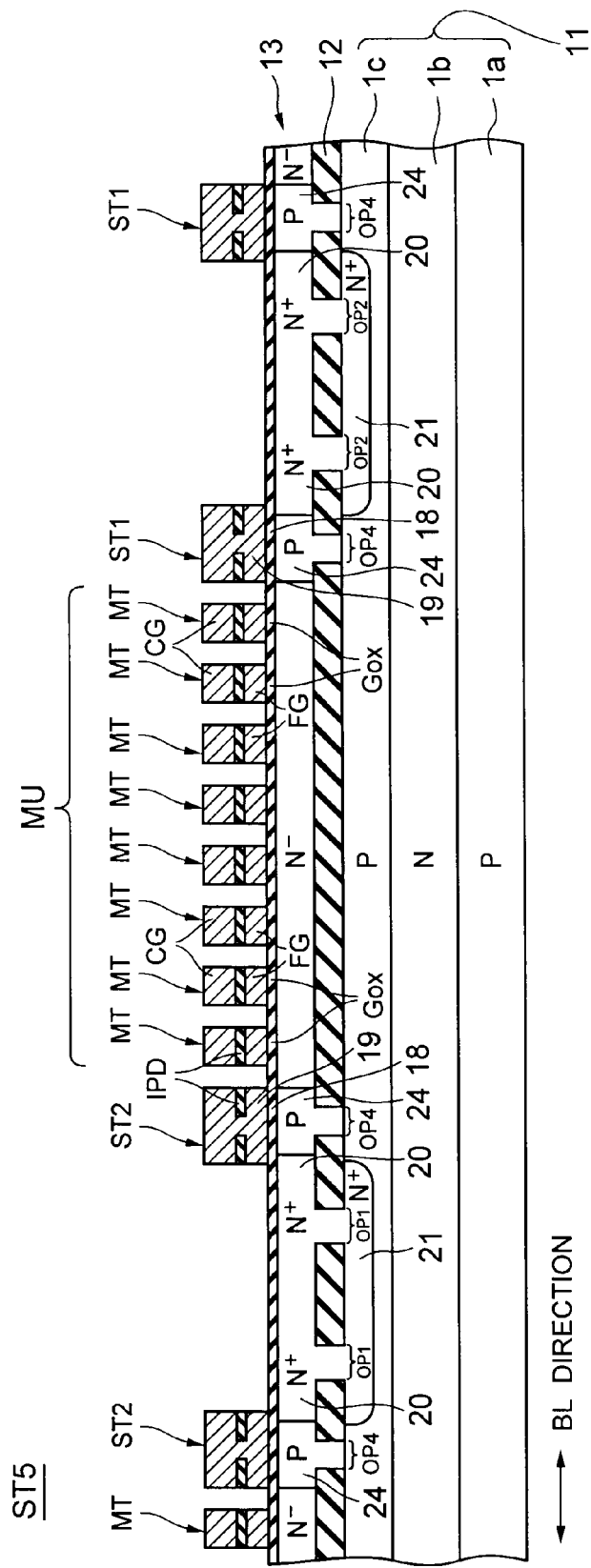
FIG. 13 is a sectional view explaining the manufacturing process of the semiconductor device following FIG. 12.

As shown in FIG. 13, an oxide film is formed on the semiconductor layer 13 to form the tunnel insulating film $G_{ox}$ and the gate insulating film 18 using, for example, thermal oxidation method and the like. After a polysilicon layer is deposited on the tunnel insulating film $G_{ox}$ and the gate insulating film 18 using a known manufacturing process, the device separation insulating film which separates a device region into a plurality of regions is formed up to the BOX layer. Upper surfaces of the memory cell transistors MT and upper surfaces of the source side and drain side select transistors ST1, ST2 are made flat using an upper surface of the device separation insulating film. The inter-gate insulating film IPD, the polysilicon layer, and the like are sequentially laminated and processed so that the memory cell transistors MT and the like are formed.

Step ST6 (Formation of Contact)

Figure 14:
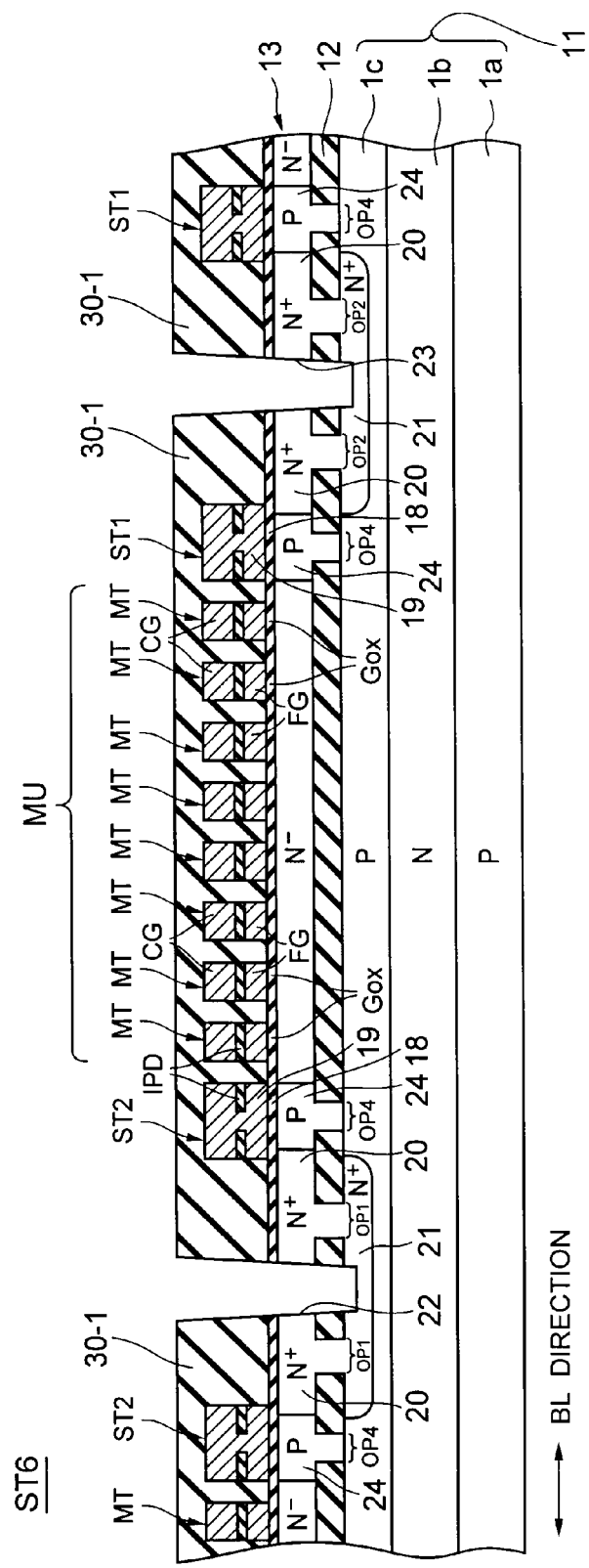
FIG. 14 is a sectional view explaining the manufacturing process of the semiconductor device following FIG. 13.
Figure 15:
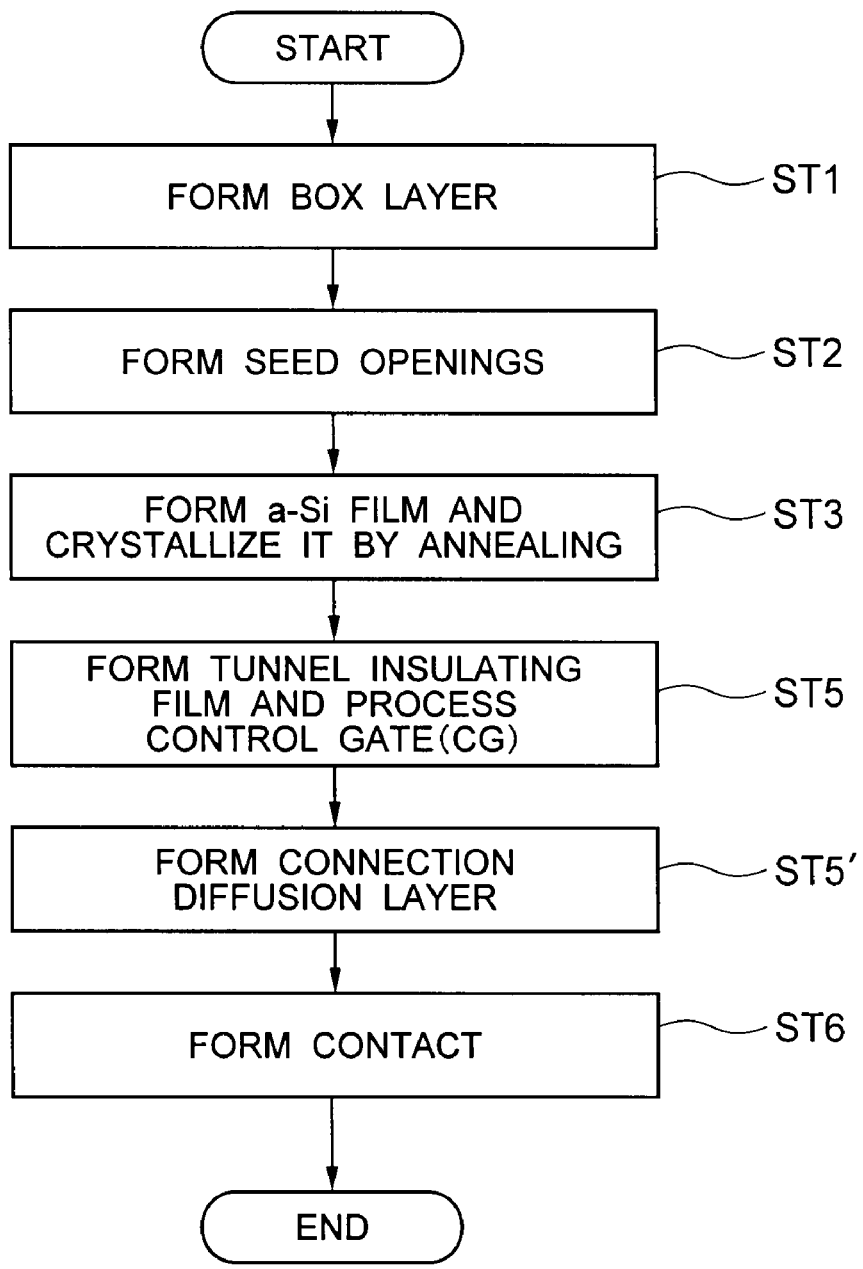
FIG. 15 is a flowchart showing a different manufacturing process of the semiconductor device according to the second embodiment of the present invention.

Spaces between the memory cell transistors MT and the like are buried by depositing the inter-layer insulating film 30-1 on the entire surface of the semiconductor substrate 11. Openings are selectively formed in the resist film at a position where the contact electrode is formed (in the second embodiment, between the select transistors ST1, ST1 and between the select transistors ST2, ST2) using a lithography technique, and the interlayer insulating film 30-1, the gate insulating film 18, the semiconductor layer 13, the BOX layer 12, and upper portions of the semiconductor substrate 11 in the openings are removed by etching such as reactive ion etching (RIE) and the like. As a result, the contact openings 22, 23 are formed as shown in FIG. 14.

Here, the contact opening 23 for the source-line contacts SC and the contact openings 22 for the bit-line contacts BC may be individually opened. With this operation, controllability of the contact openings 22, 23 is improved at their bottom positions. This is because an amount of an etching gas flowing into the contact opening 23 for the source-line contact SC formed like a line is different from that of the contact openings 22 for the bit-line contacts BC formed like a hole and an etching speed is faster in the contact opening 23 than in the contact openings 22.

The bit-line contacts BC and the source-line contact SC are formed by burying a conductive layer of, for example, titanium (Ti) and the like in the contact openings 22, 23. Note that, using a dual damascene method, the conductive layer may be buried to the contact openings 22, 23 after grooves for upper layer wires are processed.

A semiconductor memory device having the cross sectional structure of FIG. 4 can be manufactured by forming the upper layer wires and the like using a known technique.

(c) Other Manufacturing Method

Figure 7:
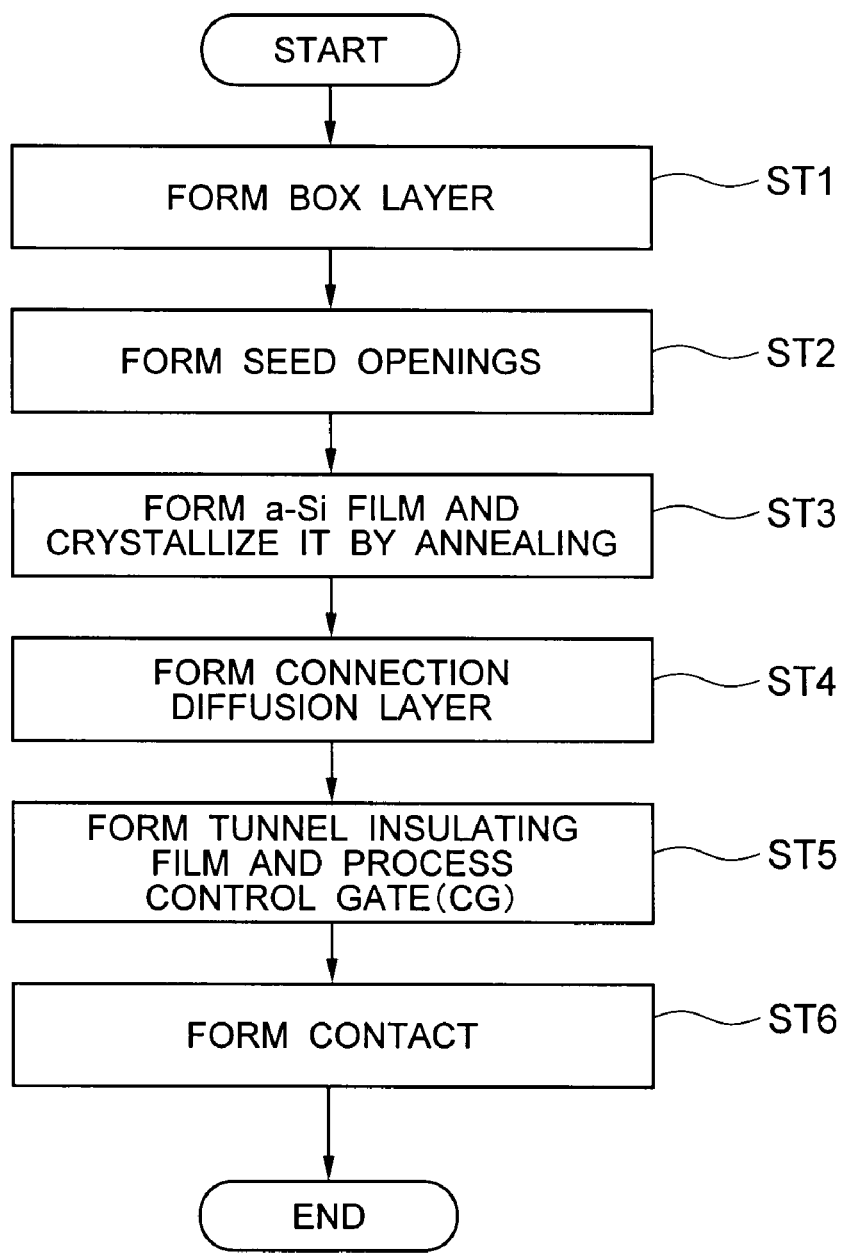
FIG. 7 is a flowchart showing a manufacturing process of the semiconductor device according to the second embodiment of the present invention.

Next, a manufacturing method, in which a process for forming the connection diffusion layers 21 are different from that of the manufacturing method described above will be described referring to FIGS. 15 to 17. The description will be given according to a flow of FIG. 15. In the flow of the drawing, the same steps as those of the flow of FIG. 7 are denoted by the same reference numerals and the description thereof is omitted.

In the manufacturing method, the following step ST5' is performed after the step ST5 (formation of the tunnel insulating film, control gate, and the like) described above in place of step ST4 (formation of the connection diffusion layers; pattern I).

Step ST5' (Formation of Connection Diffusion Layers; Pattern II)

Figure 16:
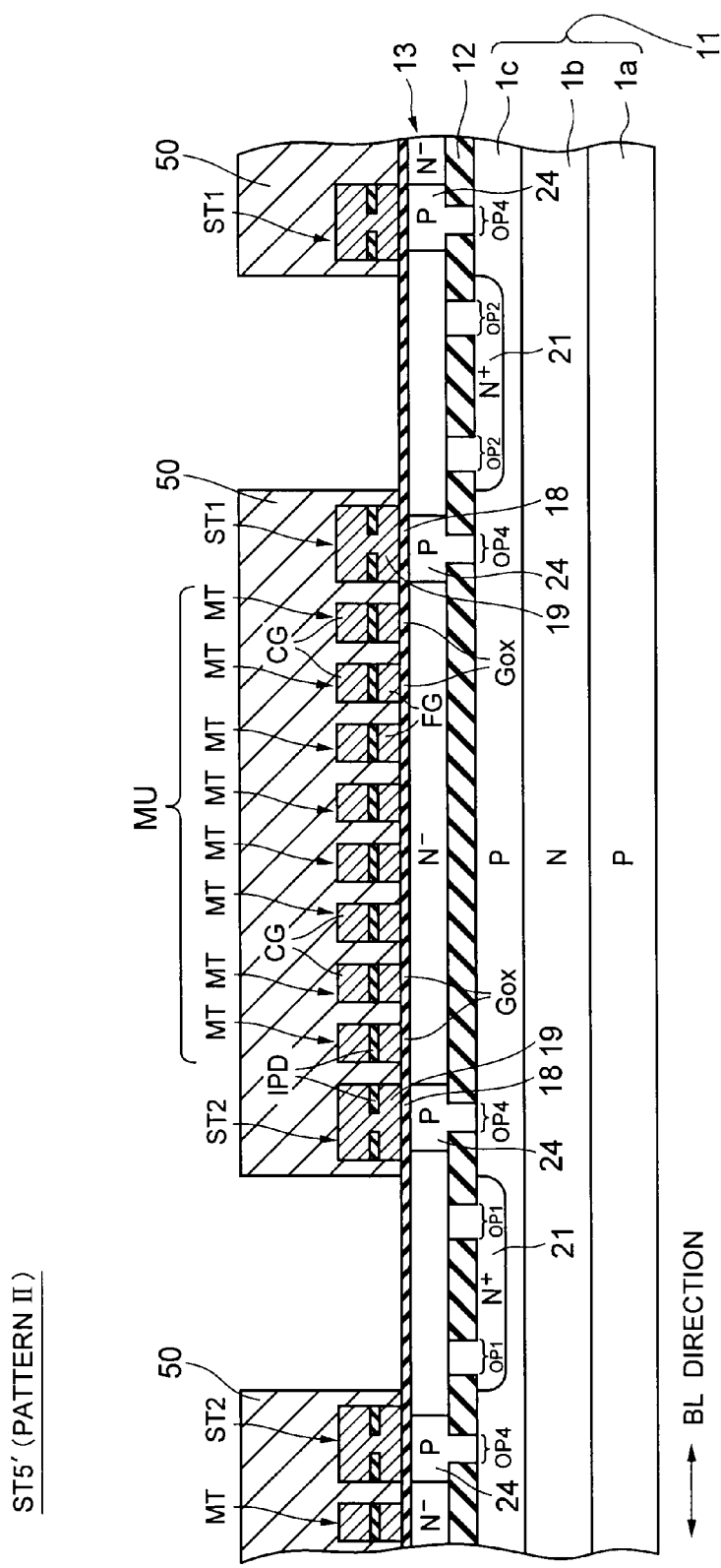
FIG. 16 is a sectional view explaining a different manufacturing process of the semiconductor device according to the second embodiment of the present invention.

As shown in FIG. 16, a resist mask 50 is formed which has openings above the openings OP1, OP2 between the source side select transistors ST1, ST1 and between the drain side select transistors ST2, ST2. Here, the gate electrodes 19 of the source side and drain side select transistors ST1, ST2 are covered by the resist mask 50. The connection diffusion layers 21 are formed from the surface of the semiconductor substrate 11 under the BOX layer 12 into the openings OP1, OP2 using ion implantation technique.

The connection diffusion layers 21 are connected to the N+ diffusion layer 20 of the source side and drain side select transistors ST1, ST2, respectively by forming the N+ diffusion layer 20 of the source side and drain side select transistors ST1, ST2 using the gate electrodes 19 of the select transistors ST1, ST2 as masks after the resist mask 50 is removed. According to the forming method, since the connection diffusion layers 21 and the N+ diffusion layer 20 of the source side and drain side select transistors ST1, ST2 can be independently made, a depth of the diffusion layers can be easily adjusted. As a result, operation characteristics of the source side and drain side the select transistors ST1, ST2 can be easily adjusted.

Further, the step ST5' may be modified as described below.

Step ST5' (Formation of Connection Diffusion Layer; Modification of Pattern II)

Figure 17:
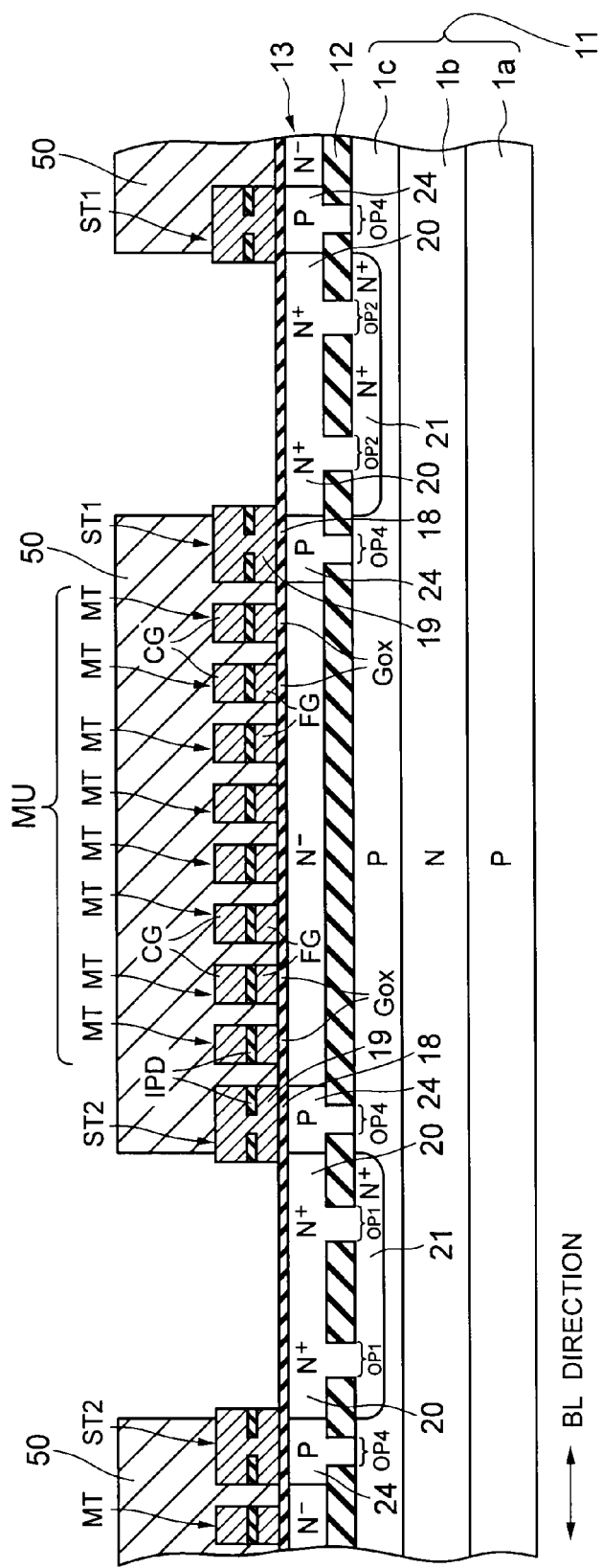
FIG. 17 is a sectional view explaining a different manufacturing process of the semiconductor device according to the second embodiment of the present invention.

A modification is different from the pattern II in that the connection diffusion layers 21 are formed by performing ion implantation in a self-alignment manner using the source side and drain side select transistors ST1, ST2 as masks. That is, as shown in FIG. 17, spaces between the memory cell transistors MT and spaces between the source side and drain side select transistors ST1, ST2 and the memory cell transistors MT are covered by a resist mask 50 and the like so that no impurity is implanted thereinto. Thereafter, ion implantation is performed. With this method, a process can be omitted by forming the connection diffusion layers 21 by the same process as that of formation of the N+ diffusion layer 20 of the source side and drain side select transistors ST1, ST2.

As described above, according to the second embodiment, since the bit-line contacts BC and the source-line contact SC in the semiconductor device are arranged using the contact structure of the first embodiment, their contact resistance can be reduced. In particular, even if the semiconductor layer 13 is thin, the contact resistance can be reduced.

Third Embodiment

Next, a third embodiment of the present invention will be described referring to FIGS. 18 and 19. The third embodiment arranges a source-line contact as a local interconnection (LI) contact in the semiconductor device of the second embodiment.

Figure 18:
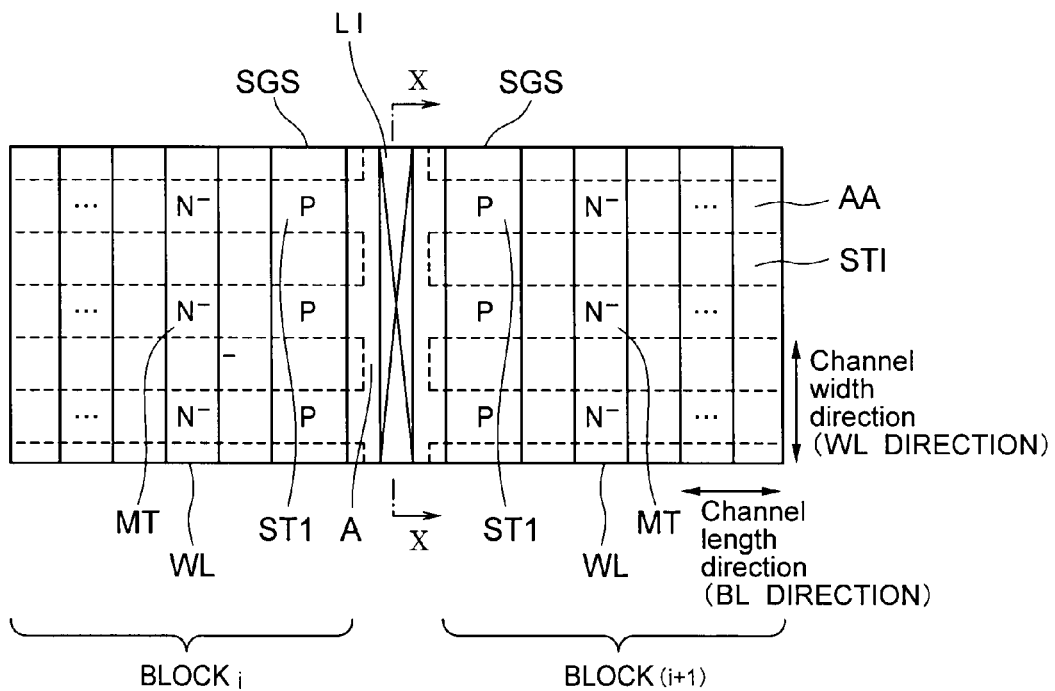
FIG. 18 is an enlarged plan view on a source line side of a memory cell unit according to a third embodiment of the present invention.

FIG. 18 is an enlarged plan view on a source line side of a memory cell unit. Further, FIG. 19 is a sectional view along a line X-X of FIG. 18. Since portions other than a periphery of the source-line contact have the same planar structure and the same cross sectional structure as those of the second embodiment described above, the illustration and description thereof will be omitted.

The LI contact will be described below. As shown in FIG. 18, source-line contact regions (regions which are in contact with the source-line contact LI (common contact electrode) in source/drain diffusion layers of source side select transistors ST) in device regions AA are connected by a diffusion layer region A for connecting the device regions AA adjacent to each other in a WL direction and arranged as one semiconductor region (common source region) extending in the WL direction. The shape of the device regions AA is called an LI shape. Further, the source-line contact LI formed in the device regions AA having the LI shape is called the LI contact. The source-line contact LI has a line-shaped structure extending in the WL direction.

Further, the source-line contact LI may have a similar structure to that of the bit-line contacts BC.

Figure 19:
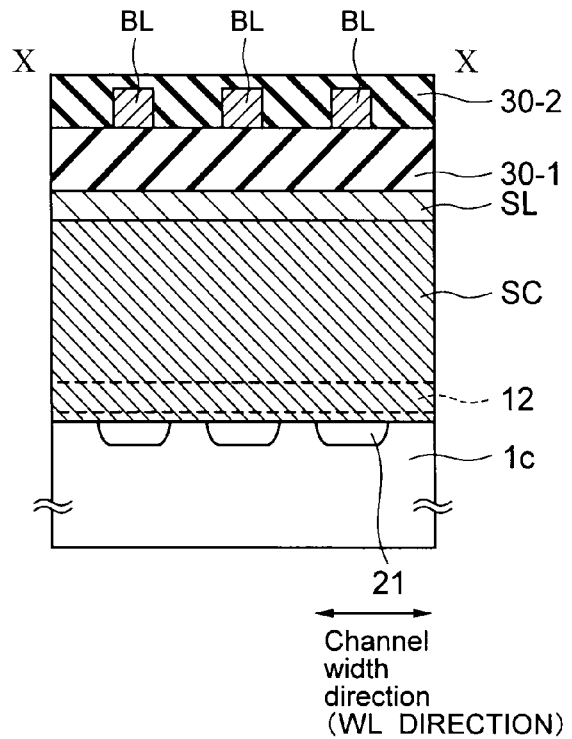
FIG. 19 is a sectional view along a line X-X of FIG. 18.

As described above, since the source-line contact region is arranged as a continuous region which is not separated by the device separation insulating films STI, the source-line contact LI is formed on a connection diffusion layers 21 and a P-well 1c having flat surfaces as shown in FIG. 19. Therefore, a bottom surface of the source-line contact LI becomes flat.

Further, as shown in FIG. 18, since gate electrodes of source side select transistors ST1 disposed on a source line side of a memory cell unit are shared by source side select transistors ST1 arranged along the WL direction and act as a source side select gate line SGS.

The source side select transistors ST1 and memory cell transistors MT share one of source/drain diffusion layers. Further, as described above, the source-line contact LI is disposed on the other (source side, outside) source/drain diffusion layer (N$^+$ diffusion layer 20 of FIG. 4) of the source side select transistors ST1.

A cross sectional structure of the source-line contact LI in a BL direction is approximately the same as that of the cross sectional structure of the second embodiment described above (FIG. 6). That is, the source-line contact LI is buried in a contact opening 23 (groove) formed in an interlayer insulating film 30-1, gate insulating films 18, a semiconductor layer 13, a BOX layer 12, and above a semiconductor substrate 11 like FIG. 4. The bottom portion of the source-line contact LI is electrically connected to the source/drain diffusion layers (N$^+$ diffusion layer 20 of FIG. 4) through connection diffusion layers 21 likewise. Further, since the source-line contact region is not separated by the device separation insulating film STI, it is not necessary to take an etching ratio of a semiconductor layer 13 and the device separation insulating film STI into consideration. As a result, a process margin can be improved because the bottom surface of the source-line contact LI can be easily made flat.

One end of the memory cell unit is electrically connected to a source line SL extending in the WL direction through the source-line contact LI.

Note that the source/drain diffusion layers and the source-line contact LI having the LI structure are shared by two adjacent blocks BLOCKi, BLOCK(i+1).

As described above, the source-line contact region and the source-line contact LI can be shared by a plurality of the device regions AA (or NAND strings) disposed along the WL direction different from the bit-line contact regions and the bit-line contacts BC. This is because the source lines SL are collectively controlled to one block BLOCKi.

As described above, according to the third embodiment, since the source-line contact LI of a semiconductor device is arranged using the contact structure of the first embodiment, its contact resistance can be reduced.

Fourth Embodiment

Next, a fourth embodiment of the present invention will be described referring to FIGS. 20 and 21. The fourth embodiment is arranged such that openings are formed in a BOX layer 12 below memory cell transistors MT in the semiconductor device according to the second embodiment.

Figure 20:
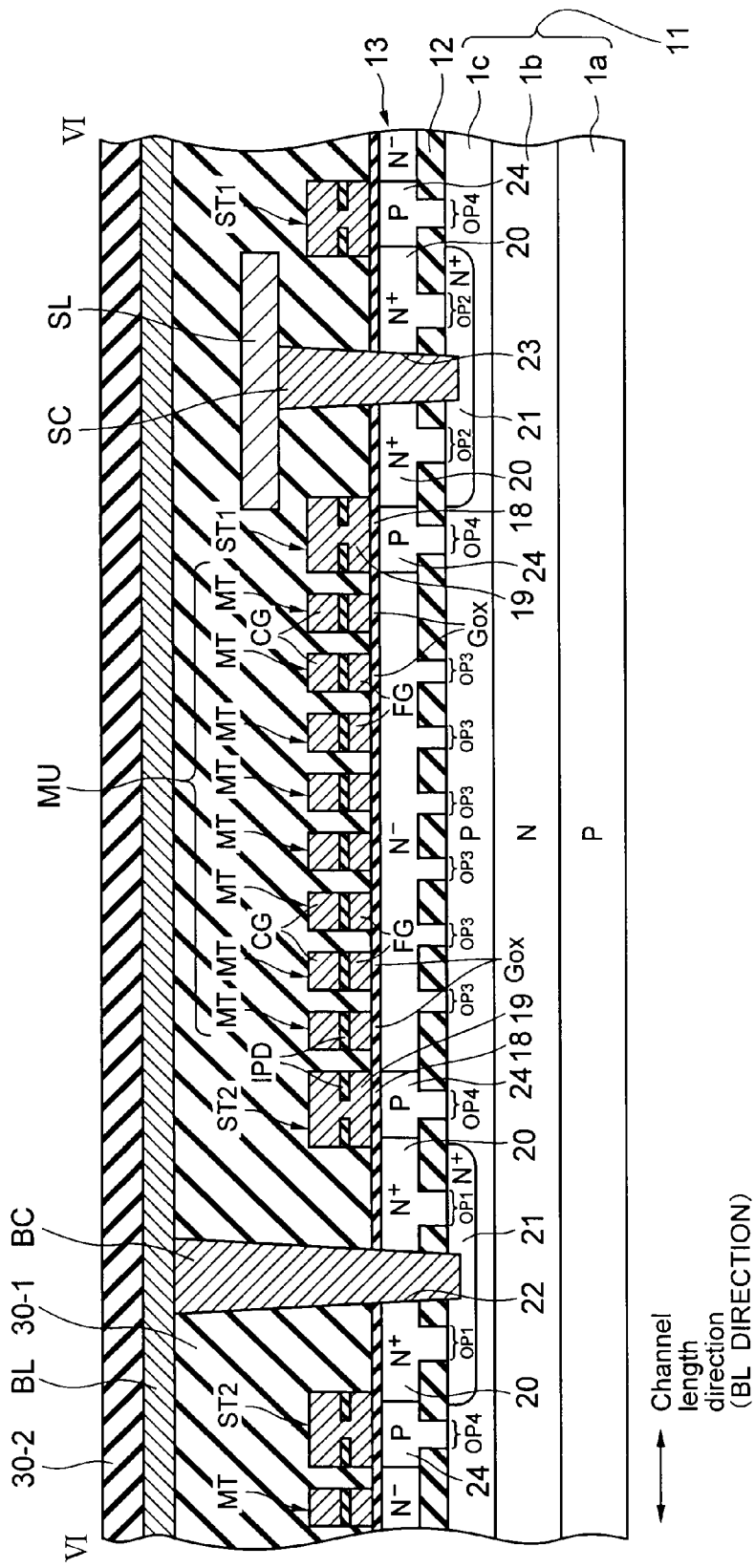
FIG. 20 is a sectional view of a semiconductor device according to a fourth embodiment of the present invention.

FIG. 20 is a sectional view of a semiconductor device according to the fourth embodiment of the present invention. As shown in the drawing, a plurality of the openings OP3 (third openings) are formed in the BOX layer 12 disposed below the memory cell transistors MT. It is not necessary to form the openings OP3 below the memory cell transistors MT, and it is sufficient that the memory cell transistors MT can be cut off as described below.

Further, a semiconductor layer 13 can be epitaxially grown more efficiently than the second embodiment of FIG. 4 by forming the plurality of openings OP3 as described above.

Since the other configuration is the same as that of the second embodiment of FIG. 4, the same components are denoted by the same reference numerals and the description thereof is omitted.

Cut-off characteristics of the memory cell transistors MT will be examined.

Figure 21A:
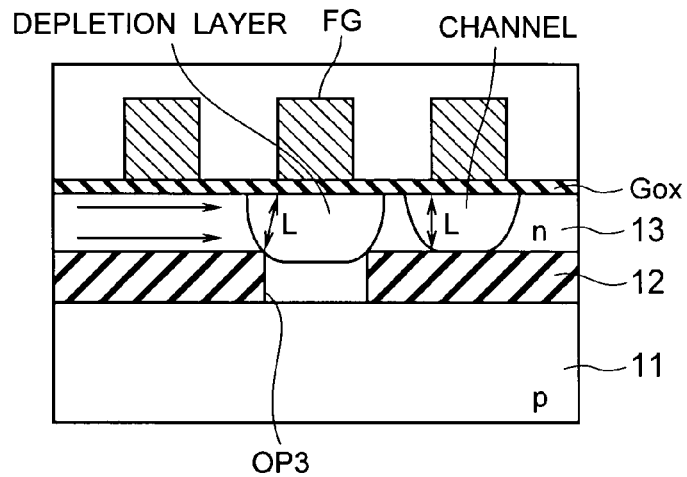
FIGS. 21A, 21B, and 21C are sectional views showing a cross section of a model for explaining cut-off characteristics of a memory cell transistor according to the fourth embodiment of the present invention.
Figure 21B:
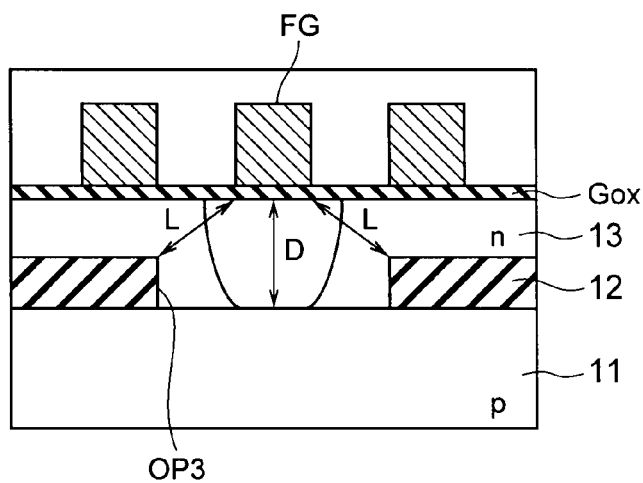
Figure 21C:
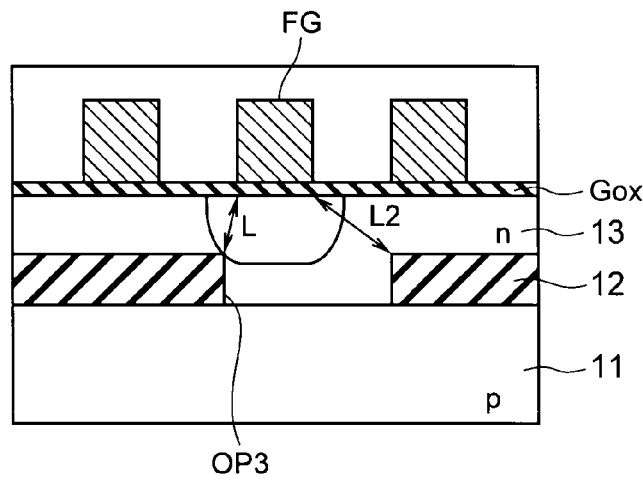

FIGS. 21A to 21C are sectional views showing a cross section of a model for explaining cut-off characteristics of the memory cell transistors MT.

As shown in FIG. 21A, an opening OP3 of the BOX layer 12 is positioned below a floating gate electrode FG of a memory cell transistor MT.

In the above configuration, a semiconductor substrate 11 is grounded, and a positive bias is applied to the floating gate electrode FG. As a result, an N-type impurity is drawn to the vicinity of a tunnel insulating film $G_{ox}$ to thereby form an accumulation layer.

In contrast, in the above configuration, when electrons are accumulated to a charge accumulation layer, a depletion layer is formed from an interface of the tunnel insulating film $G_{ox}$ depending on an amount of charge. When the amount of charge exceeds a predetermined amount, an inversion layer is formed on the interface of the tunnel insulating film $G_{ox}$.

Further, the depletion layer is also formed on the interface of the tunnel insulating film $G_{ox}$ by applying a negative bias to the floating gate electrode FG. When a larger negative bias is applied, the inversion layer is formed on the interface of the tunnel insulating film $G_{ox}$.

Here, when electrons are accumulated or when the negative bias is applied, a maximum value Wmax of a width of the depletion layer is shown by Expression (1) (refer to, for example, Physics of Semiconductor Device Second edition, S. M. Sze, P. 373).

$$W\max = \sqrt{\frac{4\varepsilon_s kT \cdot \ln(N_A/n_i)}{q^2 N_A}} \quad (1)$$

In Expression (1), coefficients and the like are as shown below.

| | |
|---|---|
| εs: | dielectric constant of silicon |
| k: | Stefan-Boltzmann coefficient |
| T: | absolute temperature |
| $N_A$: | impurity concentration in silicon layer |
| ni: | impurity concentration of silicon (no impurity is contained) (impurity is a function of temperature, and is $1.45 \times 10^{10}$ cm$^{-3}$ at 300K) |
| q: | elementary charge |

The following values can be obtained in Si from Expression (1) (T=300 K in any of the cases).

| impurity concentration $N_A$ = | $1 \times 10^{15}$ cm$^{-3}$ | Wmax = | 800 nm |
|---|---|---|---|
| | $1 \times 10^{16}$ cm$^{-3}$ | | 300 nm |
| | $1 \times 10^{17}$ cm$^{-3}$ | | 100 nm |
| | $5 \times 10^{17}$ cm$^{-3}$ | | 45 nm |
| | $1 \times 10^{18}$ cm$^{-3}$ | | 30 nm |

It is generally assumed a case that an operating temperature is 300 K or more. In the respective impurity concentrations $N_A$ in the operating temperature, it is preferable that a distance L from a bottom surface of the tunnel insulating film $G_{ox}$ in a gate electrode end to an end of the BOX layer 12 be equal to or less than the maximum value Wmax of the width of the depletion layer. This is because when the distance L is more than the maximum value Wmax, the memory cell transistors MT cannot be cut off.

Further, as shown in FIG. 21B, when a distance D from a bottom portion of the floating gate to a p/n junction is equal to or less than the maximum value Wmax of the width of the depletion layer, the memory cell transistors MT can be cut off even if the distance L is more than Wmax.

Further, as shown in FIG. 21C, when a distance L1 from the tunnel insulating film $G_{ox}$ at one end of each floating gate electrode FG to an end of the BOX layer 12 is shorter than a distance L2 from the tunnel insulating film $G_{ox}$ at the other end of the floating gate electrode FG to the end of the BOX layer 12, the distance L1 may be equal to or less than the maximum value Wmax of the width of the depletion layer, and the distance L2 may be equal to or more than the maximum value Wmax of the width of the depletion layer. This is because when at least one of the distances is equal to or less than the maximum value Wmax of the width of the depletion layer, the memory cell transistors MT can be cut off.

From the above-mentioned, the memory cell transistors MT can maintain desired cut-off characteristics by adjusting the impurity concentration in the semiconductor layer 13 regardless of presence or absence and positions of the openings OP3 under the floating gate electrodes FG of the memory cell transistors MT. More specifically, since it is not necessary to take a positional relation between the memory cell transistors MT and the openings OP3 into consideration, a degree of freedom of a layout can be improved.

In FIG. 20, a bottom portion of the semiconductor layer 13 in a region of a memory cell unit MU, i.e., a bottom portion of an N-type impurity region is equal to a bottom portion of the BOX layer 12. However, when the distance D is equal to or less than the maximum value Wmax of the width of the depletion layer, the bottom portion of the N-type impurity region may not be equal to the bottom portion of the BOX layer 12.

Note that, although the floating gate type memory cell is described as an example in FIGS. 21A to 21C, this is similar to a MONOS type memory cell.

Fifth Embodiment

Next, a fifth embodiment of the present invention will be described referring to FIG. 22. In the fifth embodiment, it is assumed that the openings OP1 to OP4 in the first to fourth embodiments are set to a predetermined width.

Figure 22:
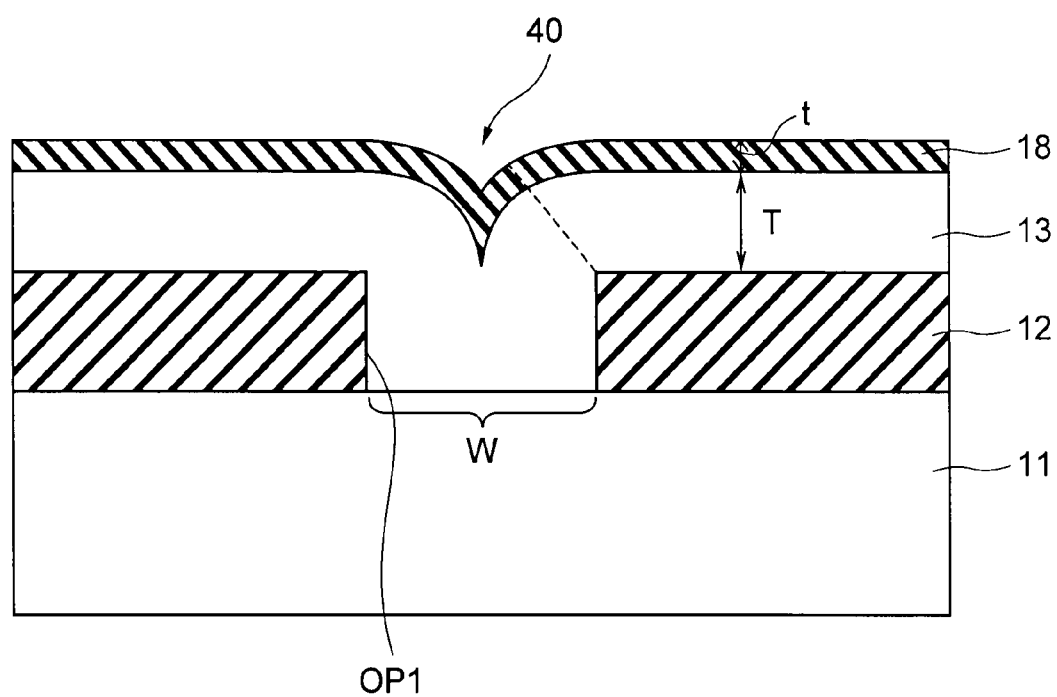
FIG. 22 is a sectional view of an opening of a semiconductor device according to a fifth embodiment of the present invention.

FIG. 22 is a sectional view of an opening in a semiconductor device according to a fifth embodiment. The view schematically shows, for example, the opening OP1 of the first embodiment of FIG. 1 in enlargement.

In the semiconductor device, an opening width W of a bottom portion of an opening OP1 is formed narrower than (a thickness t of a gate insulating film 18+a thickness T of a semiconductor layer 13)×2.

According to the fifth embodiment, disconnection of the semiconductor layer 13 above the opening OP1 can be suppressed by narrowing the opening width W of the bottom portion of the opening OP1 of a BOX layer 12.

Further, since a gouging 40 of a surface of the semiconductor layer 13 is reduced by narrowing the opening width W, flatness of the surface of the semiconductor layer 13 can be improved. As a result, deterioration of electric characteristics of the semiconductor layer 13 can be improved.

Accordingly, electric characteristics of the transistors, the memory cell transistors, and the like formed on the surface of the semiconductor layer 13 can be improved by setting the openings OP1 to OP4 of the first to fourth embodiments to the opening width of the fifth embodiment.

Further, in the first to fourth embodiments, when the contact openings 22, 23 are previously formed in the BOX layer 12 before the semiconductor layer 13 and the like are formed, the contact openings 22, 23 may be set to the opening width of the fifth embodiment. With this configuration, a gouging wider than the opening width of the contact openings 22, 23 is unlike to occur, the contact openings 22, 23 can be formed in a stable depth without depending on a dispersion of processes.

Note that in the contact opening 23 of the second to fourth embodiments, the opening width W shows a width in the BL direction.

Although the embodiments of the present invention have been described above in detail, a specific configuration is not limited to the above embodiments and can be implemented by being variously modified within a scope which does not depart from a gist of the present invention.

For example, a conductive type of the semiconductor substrate 11 and the like may be opposite to that described above.

Figure 23:
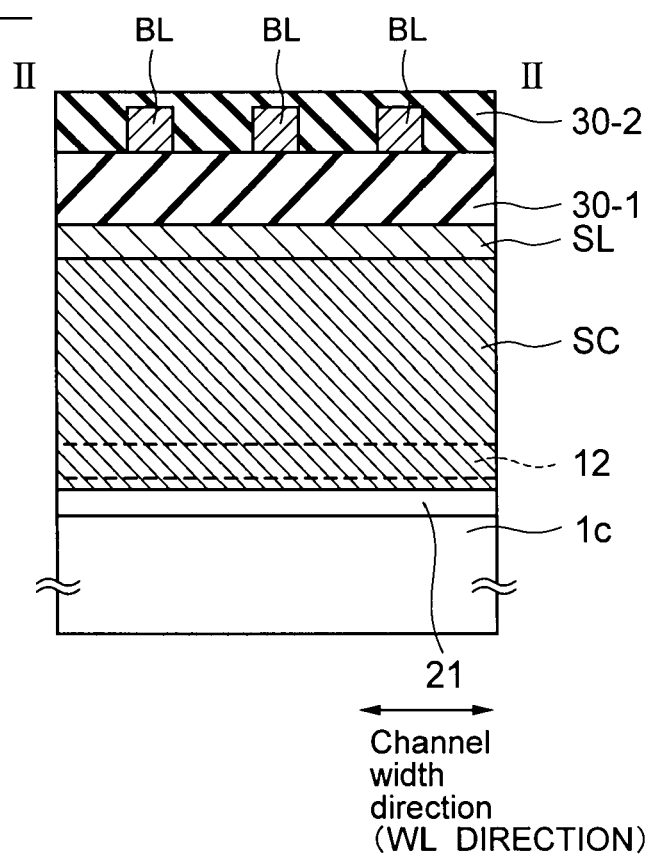
FIG. 23 is a sectional view showing a modification of a connection diffusion layer in a source-line contact according to the embodiments of the present invention.

Further, as shown in FIG. 23, the connection diffusion layers 21 of the source contact region may constitute a common connection layer 21 by being formed on an overall lower surface of the source line contact SC. As a result, a contact resistance of the source line contact SC can be reduced. Note that the connection diffusion layers 21 may be formed on an overall lower surface of the source line contact LI in the third embodiment.

Further, although the floating gate memory cell is described as an example in the second to fourth embodiments, a MONOS type memory cell may be employed.

Further, although the NAND type non-volatile semiconductor memory device is described as an example in the second to fourth embodiments, the example may be a NOR type non-volatile semiconductor memory device.

The invention claimed is:

1. A semiconductor device formed on a SOI substrate having a semiconductor substrate, a buried oxide film formed on the semiconductor substrate, and a semiconductor layer formed on the buried oxide film, the semiconductor substrate having a first conductive type, the semiconductor layer having a second conductive type, wherein
the buried oxide film has a first opening opened therethrough for communicating the semiconductor substrate with the semiconductor layer,
the semiconductor layer is arranged to have a first buried portion buried in the first opening in contact with the semiconductor substrate and a semiconductor layer main portion positioned on the first buried portion and on the buried oxide film,
the semiconductor substrate has a connection layer buried in a surface of the semiconductor substrate and electrically connected to the first buried portion in the first opening, the connection layer having the second conductive type, and
the semiconductor device comprises a contact electrode buried in a second opening, a side surface of the contact electrode being connected to the semiconductor layer main portion, a bottom surface of the contact electrode being connected to the connection layer, the second opening passing through the semiconductor layer main portion and the buried oxide film, and the second opening reaching a surface portion of the connection layer.

2. The semiconductor device according to claim 1, comprising a switching transistor having:
a gate insulating film formed on the semiconductor layer main portion of the semiconductor layer;
a gate electrode formed on the gate insulating film; and
a pair of source/drain layers formed in the semiconductor layer main portion so as to be located at both sides of the gate electrode, one of the source/drain layers being connected to a side surface of the contact electrode and connected to a bottom surface of the contact electrode through the first buried portion and the connection layer.

3. The semiconductor device according to claim 2, comprising a NAND string having:
a transistor unit having a plurality of memory cell transistors arranged in a first direction; and
a drain side select transistor and a source side select transistor, the drain side select transistor and the source side select transistor being arranged on both ends of the transistor unit, at least one of the drain side select transistor and the source side select transistor being the switching transistor.

4. The semiconductor device according to claim 3, comprising a plurality of the NAND strings arranged in a second direction crossing the first direction,
the outside source/drain layers of a plurality of the source side select transistors of the plurality of NAND strings being electrically connected to each other in the second direction to form a common source region,
the contact electrode extending in the second direction to form a common contact electrode, and
the common source region being connected to the common contact electrode.

5. The semiconductor device according to claim 3, comprising a plurality of the NAND strings arranged in a second direction crossing the first direction,
the connection layers, to which the outside source/drain layers of a plurality of the source side select transistors of the plurality of NAND strings are electrically connected, being electrically connected to each other in the second direction to form a common connection layer,
the contact electrode extending in the second direction to form a common contact electrode, and
the common connection layer being connected to the common contact electrode.

6. The semiconductor device according to claim 3, wherein the first opening is formed between the second opening and the drain side select transistor or the source side select transistor.

7. The semiconductor device according to claim 3, wherein
a third opening is formed in the buried oxide film below the memory cell transistor, and
the semiconductor layer has a second buried portion buried in the third opening and is in contact with the semiconductor substrate, the second buried portion having the second conductive type.

8. The semiconductor device according to claim 7, wherein
the memory cell transistor has a gate structure on the gate insulating film, and
the semiconductor layer and the third opening are arranged such that the shortest distance from a certain bottom portion of the gate insulating film to an upper edge portion of the third opening is equal to or less than a maximum value of a width of a depletion layer formed in the semiconductor layer, the certain bottom portion being located under a edge portion of the gate structure.

9. The semiconductor device according to claim 7, wherein
the memory cell transistor has a gate structure on the gate insulating film, and
the semiconductor layer and the third opening are arranged such that the shortest distance from a certain bottom surface of the gate insulating film to a contact surface of the second buried portion and the semiconductor substrate is equal to or less than a maximum value of a width of a depletion layer formed in the semiconductor layer, the certain bottom surface being located under the gate structure of the memory cell transistor.

10. The semiconductor device according to claim 3, wherein
the semiconductor layer main portion has a channel region positioned between the source/drain layers under the respective gate electrodes of the drain side select transistor and the source side select transistor, the channel region having the first conductive type,
the buried oxide film has a fourth opening under the channel region,
the semiconductor layer has a third buried portion buried in the fourth opening in contact with the channel region and the semiconductor substrate, the third buried portion having the first conductive type, and
the channel region is connected to the semiconductor substrate through the third buried portion.

11. The semiconductor device according to claim 1, wherein a diffusion layer having a conductive type different from that of the connection layer is formed under the connection layer.

12. The semiconductor device according to claim 11, wherein the bottom surface of the contact electrode is shallower than that of the connection layer.

13. The semiconductor device according to claim 1, comprising an insulating film on the semiconductor layer main portion of the semiconductor layer, an opening width of a bottom portion of at least one of the first opening and the second opening being formed narrower than (thickness of the insulating film+thickness of the semiconductor layer main portion)×2.

14. A method of manufacturing a semiconductor device, comprising:
- forming a buried oxide film on a semiconductor substrate having a first conductive type;
- forming a first opening in the buried oxide film, the first opening reaching a surface portion of the semiconductor substrate;
- forming a semiconductor layer on the semiconductor substrate in the first opening and on the buried oxide film;
- after the semiconductor layer is formed, forming a connection layer in a certain surface portion of the semiconductor substrate, the certain surface portion being located under the first opening and a peripheral portion of the first opening, the connection layer having a second conductive type;
- forming a diffusion layer in a specific portion of the semiconductor layer, the diffusion layer being connected to the connection layer through the first opening, the specific portion being located above the connection layer, the diffusion layer having the second conductive type;
- forming a second opening in the diffusion layer and in the buried oxide film, the second opening reaching a surface portion of the connection layer; and
- forming a contact electrode in the second opening.

15. The method of manufacturing the semiconductor device according to claim 14, comprising:
- after the diffusion layer is formed and before the second opening is formed,
  - forming a gate insulating film on the semiconductor layer; and
  - forming on the gate insulating film, gate structures of a plurality of memory cell transistors arranged in a first direction and gate electrodes of a drain side select transistor and a source side select transistor arranged at both the ends of a transistor unit having the plurality of memory cell transistors, so that one of source/drain layers of at least one of the drain side select transistor and the source side select transistor is the diffusion layer.

16. The method of manufacturing the semiconductor device according to claim 14, comprising:
- after the connection layer is formed and before the diffusion layer is formed,
  - forming a gate insulating film on the semiconductor layer; and
  - forming on the gate insulating film, gate structures of a plurality of memory cell transistors arranged in a first direction and gate electrodes of a drain side select transistor and a source side select transistor arranged at both the ends of a transistor unit having the plurality of memory cell transistors, so that one of source/drain layers of at least one of the drain side select transistor and the source side select transistor is the diffusion layer to be formed in the semiconductor layer.

17. The method of manufacturing the semiconductor device according to claim 14, comprising:
- after the semiconductor layer is formed and before the connection layer is formed,
  - forming a gate insulating film on the semiconductor layer; and
  - forming on the gate insulating film, gate structures of a plurality of memory cell transistors arranged in a first direction and gate electrodes of a drain side select transistor and a source side select transistor arranged at both the ends of a transistor unit having the plurality of memory cell transistors, so that one of source/drain layers of at least one of the drain side select transistor and the source side select transistor is the diffusion layer to be formed in the semiconductor layer.

18. The method of manufacturing the semiconductor device according to claim 17, wherein formation of the connection layer includes:
- forming a resist mask covering between the gate electrode of the drain side select transistor and the gate electrode of the source side select transistor positioned to both the ends of the transistor unit, and covering the gate electrodes, the resist mask having an opening above the first opening and a peripheral portion of the first opening;
- performing ion implantation using the resist mask as a mask; and
- removing the resist mask after the ion implantation is performed, and
- wherein formation of the diffusion layer includes performing ion implantation using the gates electrodes as masks.

19. A method of manufacturing the semiconductor device according to claim 17, wherein formation of the connection layer and formation of the diffusion layer includes:
- forming a resist mask covering between the gate electrode of the drain side select transistor and the gate electrode of the source side select transistor positioned to both the ends of the transistor unit, the resist mask having an opening above the first opening and a peripheral portion of the first opening, the gate electrodes being partially exposed in the opening; and
- performing ion implantation using the resist mask and the exposed gate electrodes as masks.

* * * * *